United States Patent
Krause et al.

(10) Patent No.: US 8,520,311 B2
(45) Date of Patent: Aug. 27, 2013

(54) LASER OPTICS AND DIODE LASER

(75) Inventors: Volker Krause, Lonnig (DE);
Christoph Ullmann, Bad Honnef (DE)

(73) Assignee: Laserline Gesellschaft fur Entwicklung und Vertrieb Von Diodenlasern mbH, Mulheim-Karlich (DE)

(*) Notice: Subject to any disclaimer, the term of this patent is extended or adjusted under 35 U.S.C. 154(b) by 502 days.

(21) Appl. No.: 12/656,787

(22) Filed: Feb. 16, 2010

(65) Prior Publication Data
US 2010/0265713 A1    Oct. 21, 2010

(30) Foreign Application Priority Data

Feb. 13, 2009 (DE) .......... 10 2009 008 918
Jun. 22, 2009 (DE) .......... 10 2009 030 120
Jun. 30, 2009 (DE) .......... 10 2009 031 046

(51) Int. Cl.
G02B 27/30 (2006.01)
(52) U.S. Cl.
USPC .......................................... 359/641
(58) Field of Classification Search
USPC .......................................... 359/641
See application file for complete search history.

(56) References Cited

U.S. PATENT DOCUMENTS

| | | | |
|---|---|---|---|
| 4,763,975 A | 8/1988 | Scifres et al. | |
| 4,818,062 A | 4/1989 | Scifres et al. | |
| 5,127,068 A | 6/1992 | Baer et al. | |
| 5,168,401 A | 12/1992 | Endriz | |
| 5,258,989 A | 11/1993 | Raven | |
| 5,268,978 A | 12/1993 | Po et al. | |
| 5,805,748 A * | 9/1998 | Izawa | 385/15 |
| 5,986,794 A | 11/1999 | Krause et al. | |

FOREIGN PATENT DOCUMENTS

| | | |
|---|---|---|
| DE | 1 950 053 | 10/1970 |
| DE | 44 38 368 | 5/1996 |
| DE | 195 44 488 | 6/1997 |
| DE | 19841285 | 6/2000 |
| DE | 19918444 | 2/2001 |
| EP | 0 484 276 | 5/1992 |
| EP | 0863588 | 9/1998 |
| EP | 1081819 | 3/2001 |
| WO | WO 95/15510 | 6/1995 |
| WO | WO01/69304 | 9/2001 |
| WO | WO2005/059626 | 6/2005 |

* cited by examiner

Primary Examiner — James Jones
(74) Attorney, Agent, or Firm — Welsh Flaxman & Gitler LLC

(57) ABSTRACT

Laser optical system for shaping at least one laser beam bundle made up of a plurality of laser beams generated respectively by an emitter, the emitters being offset relative to one another in a slow axis of the laser beams and at a distance from one another, with at least one plate fan located in the beam path of the laser beam bundle, which (plate fan) consists of several plates made of a light transmitting material, which (plates) are arranged offset in the direction perpendicular to their surface sides and are arranged with their surface sides in planes which enclose the beam direction and the fast axis of the laser beams, the plates forming respectively one first preferably flat plate narrow side for one beam entry and opposite this side one second preferably flat plate narrow side for the beam exit.

27 Claims, 17 Drawing Sheets

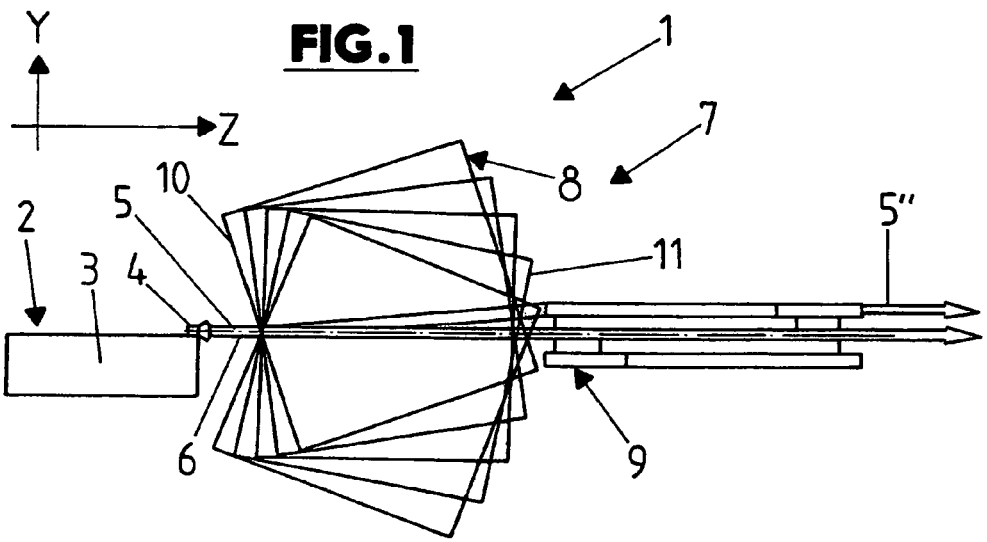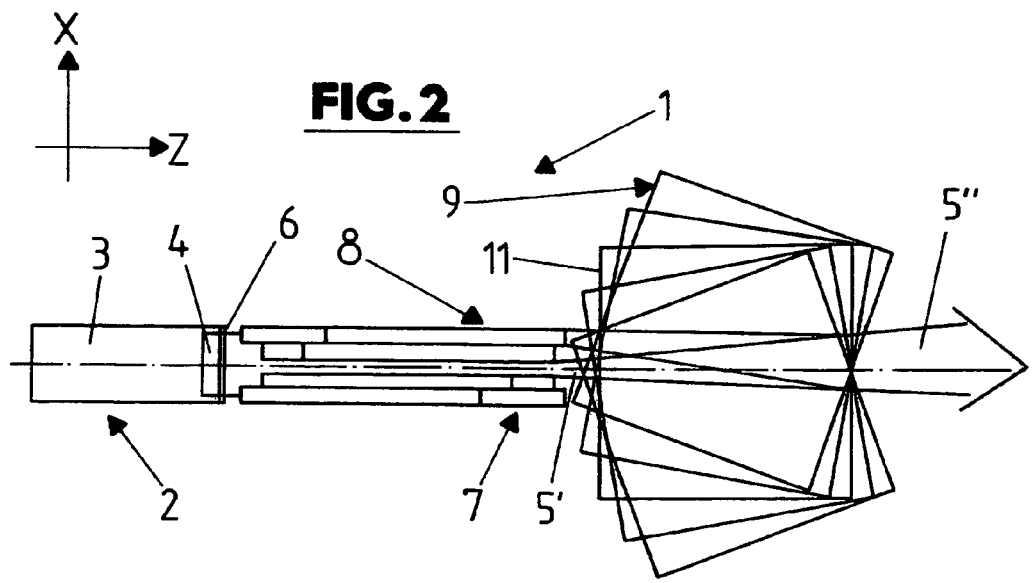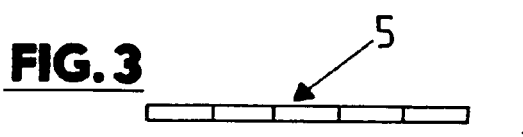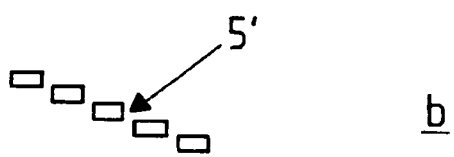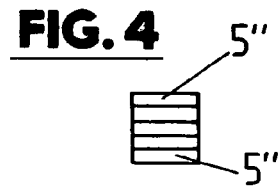

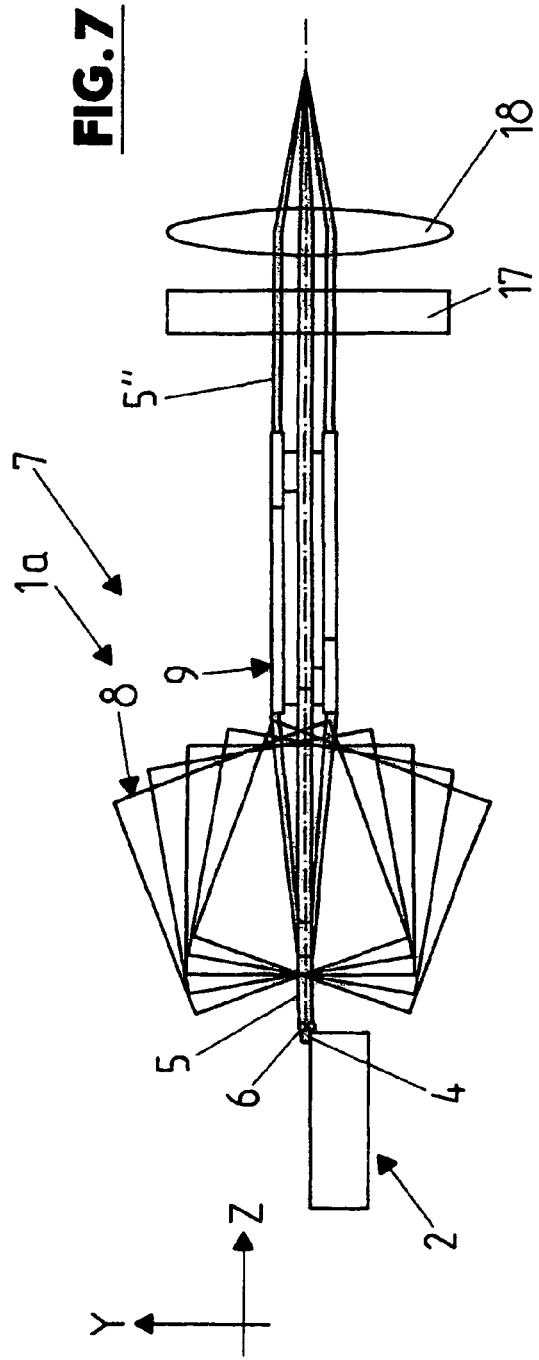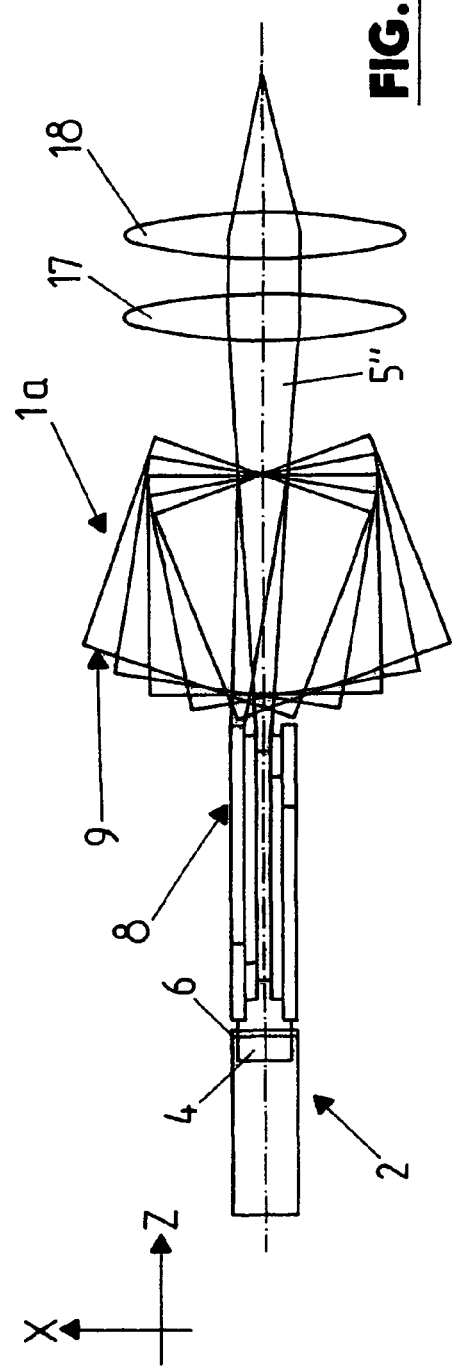

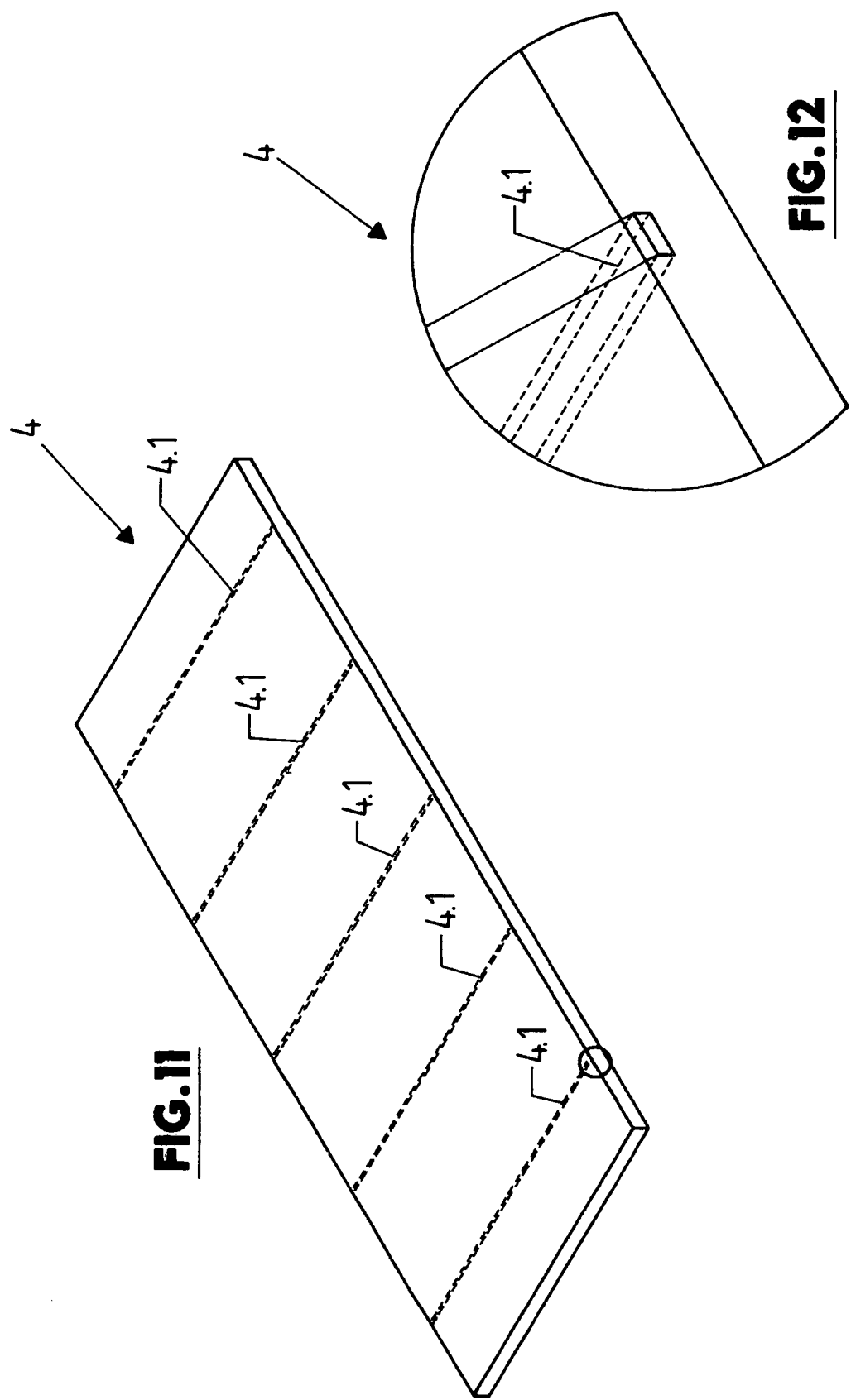

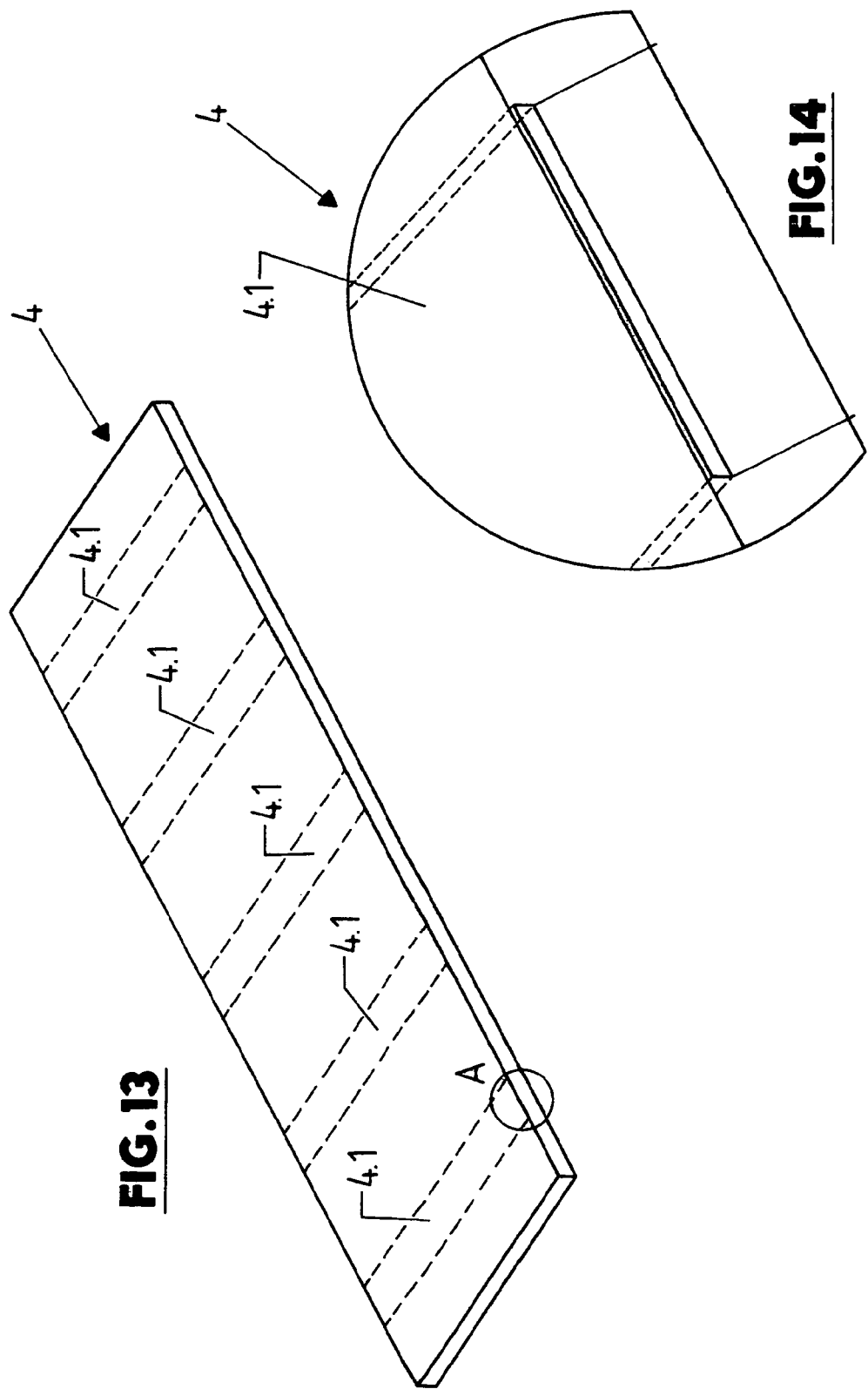

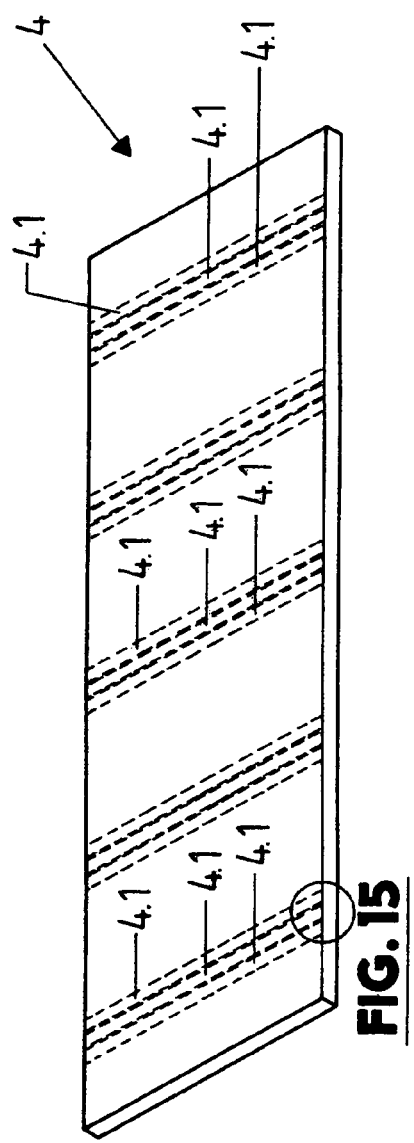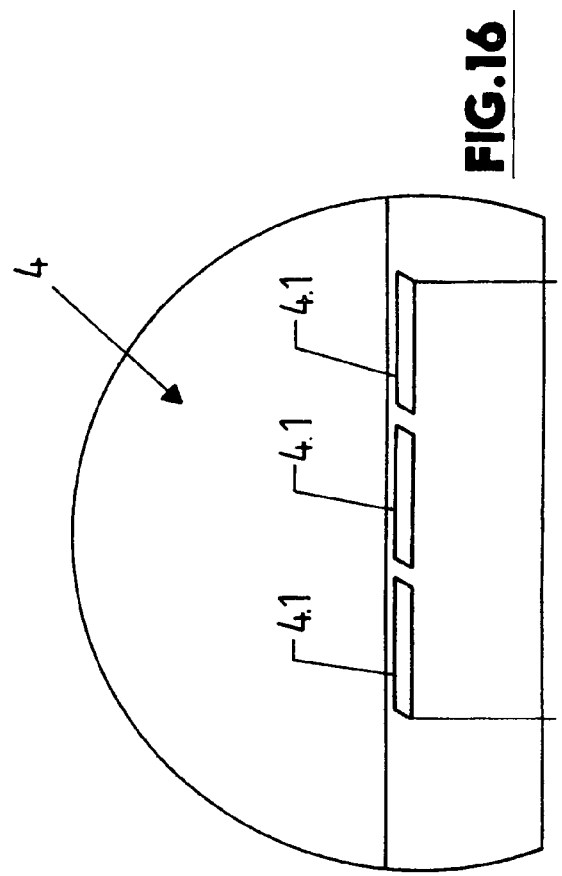

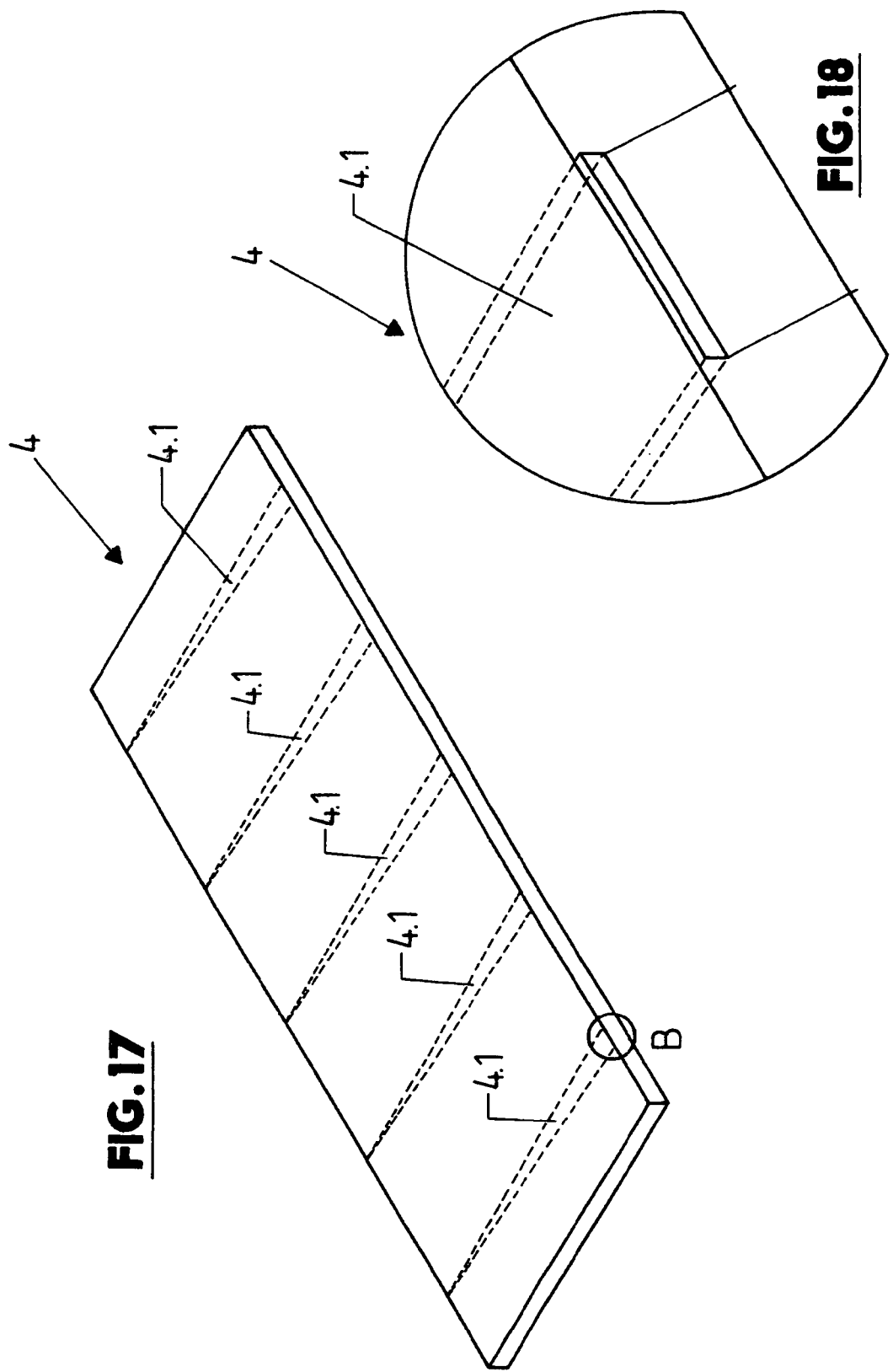

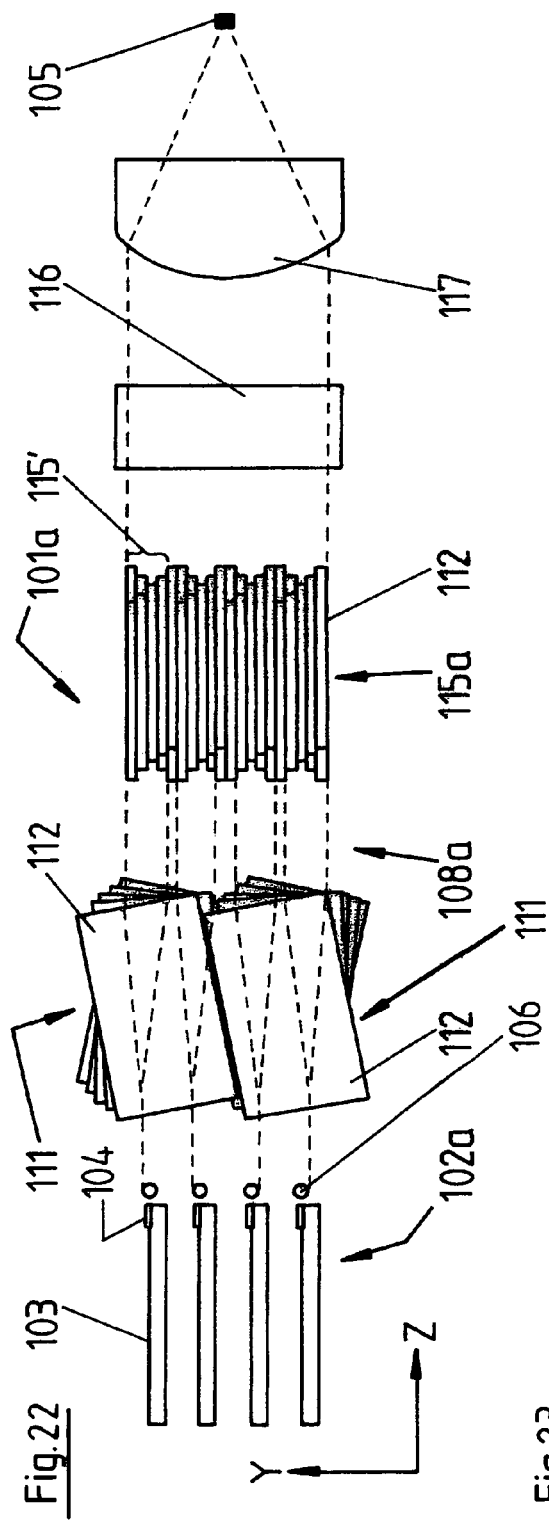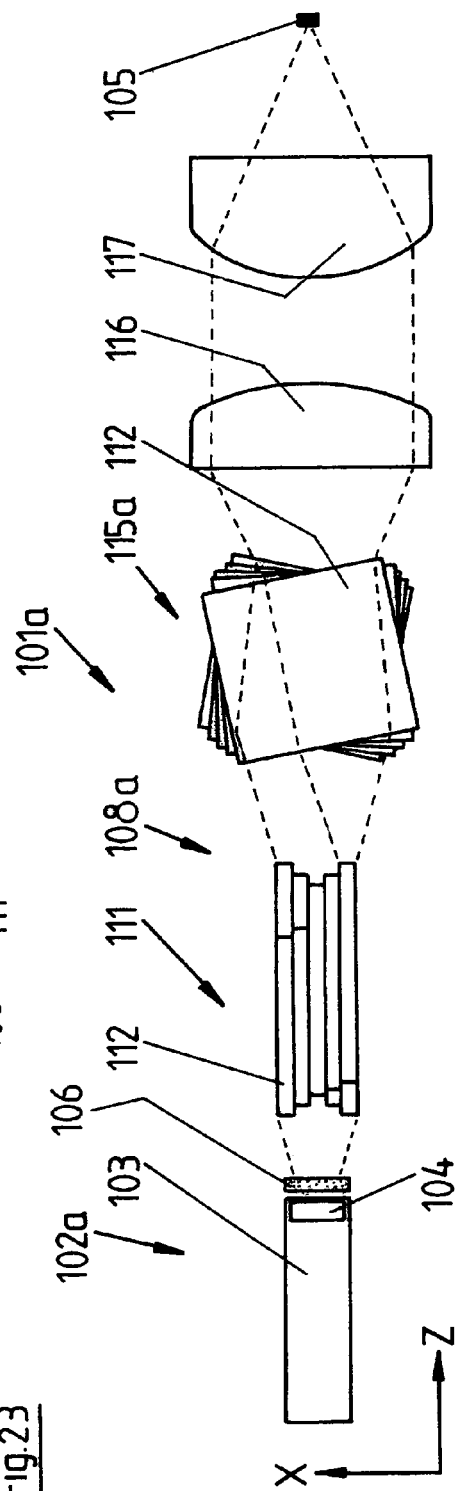

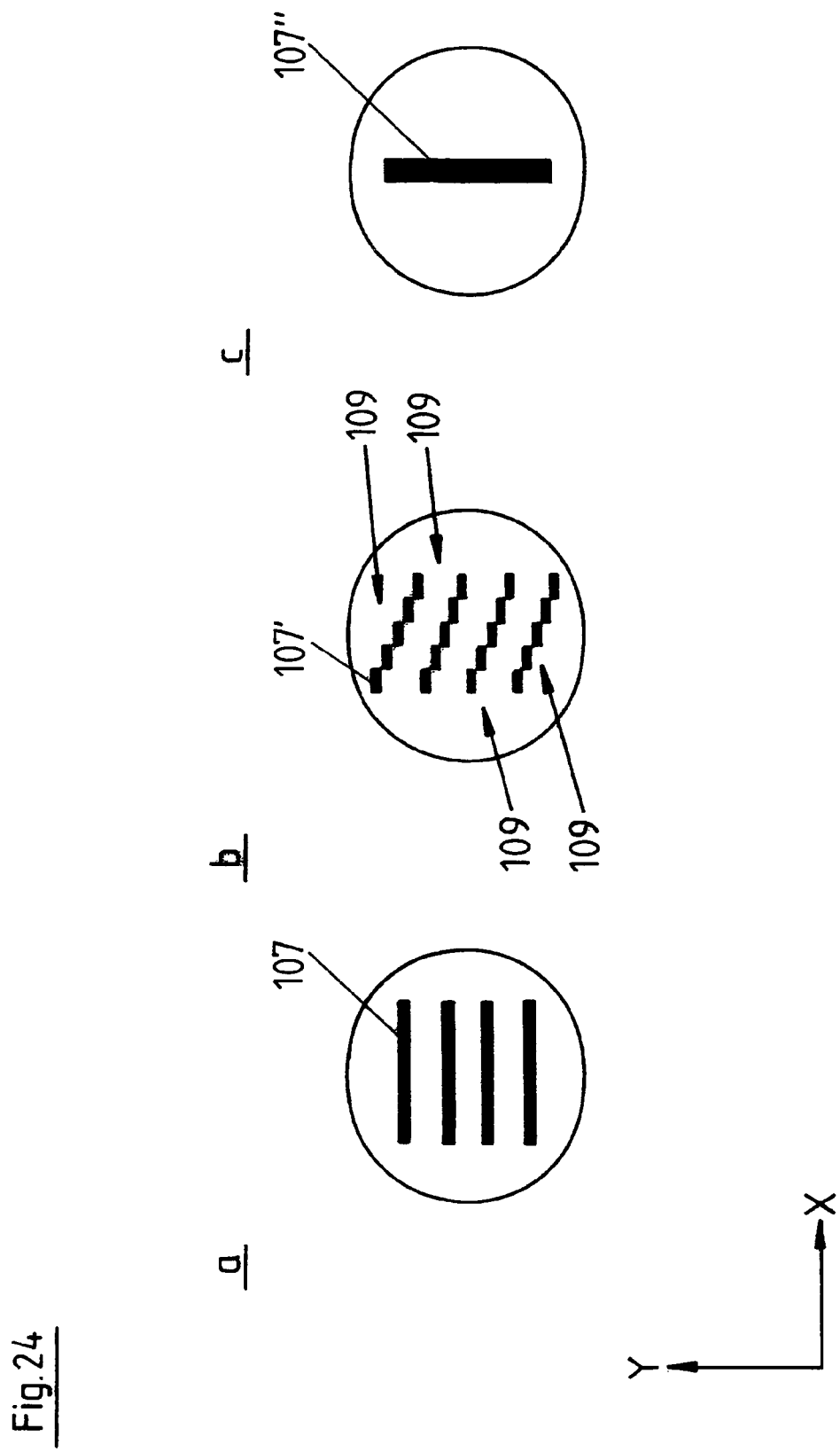

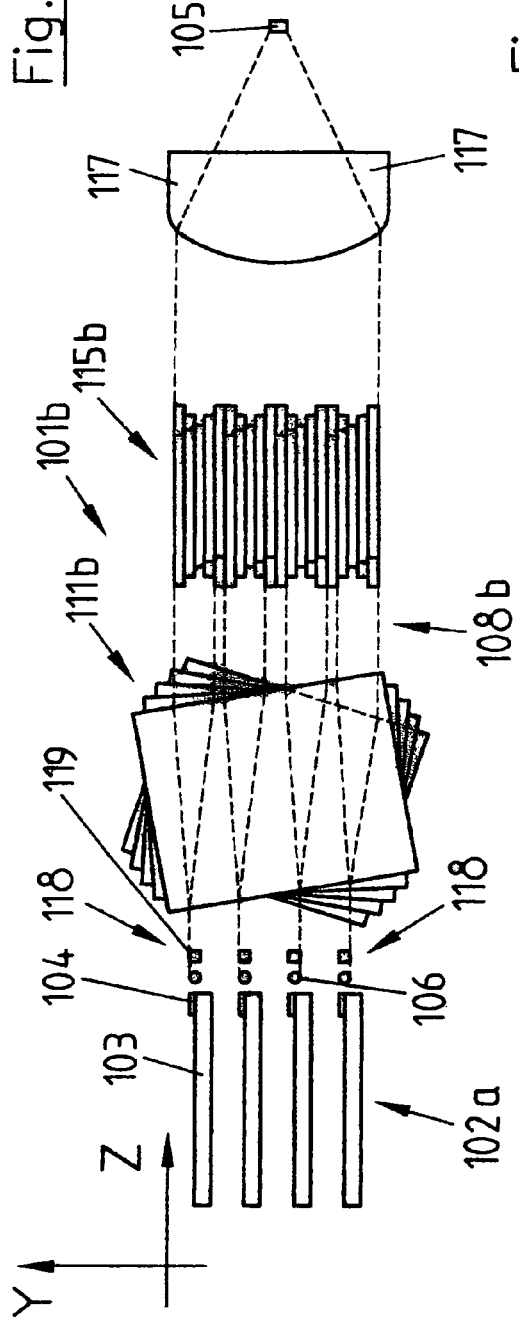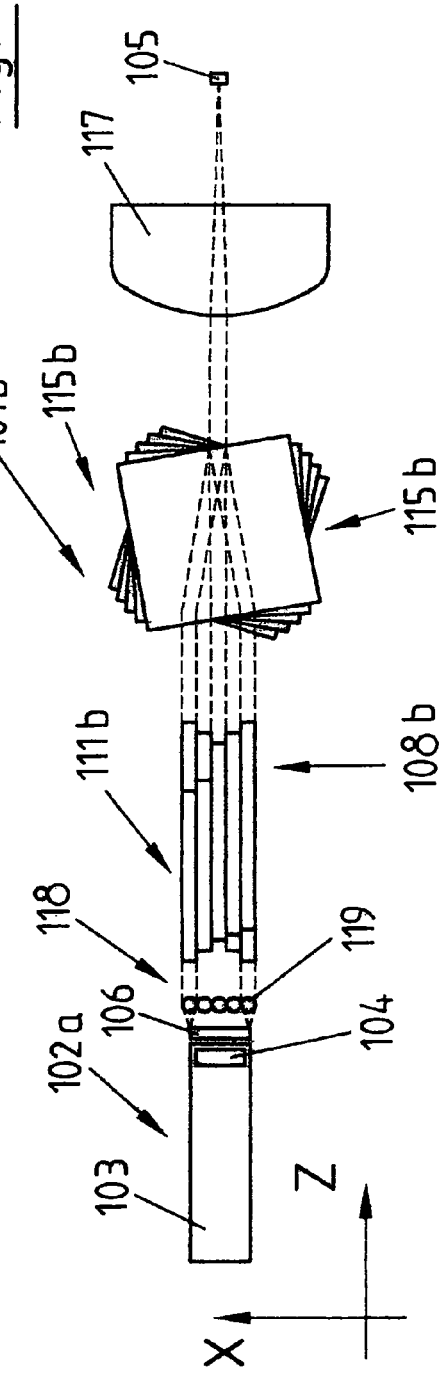

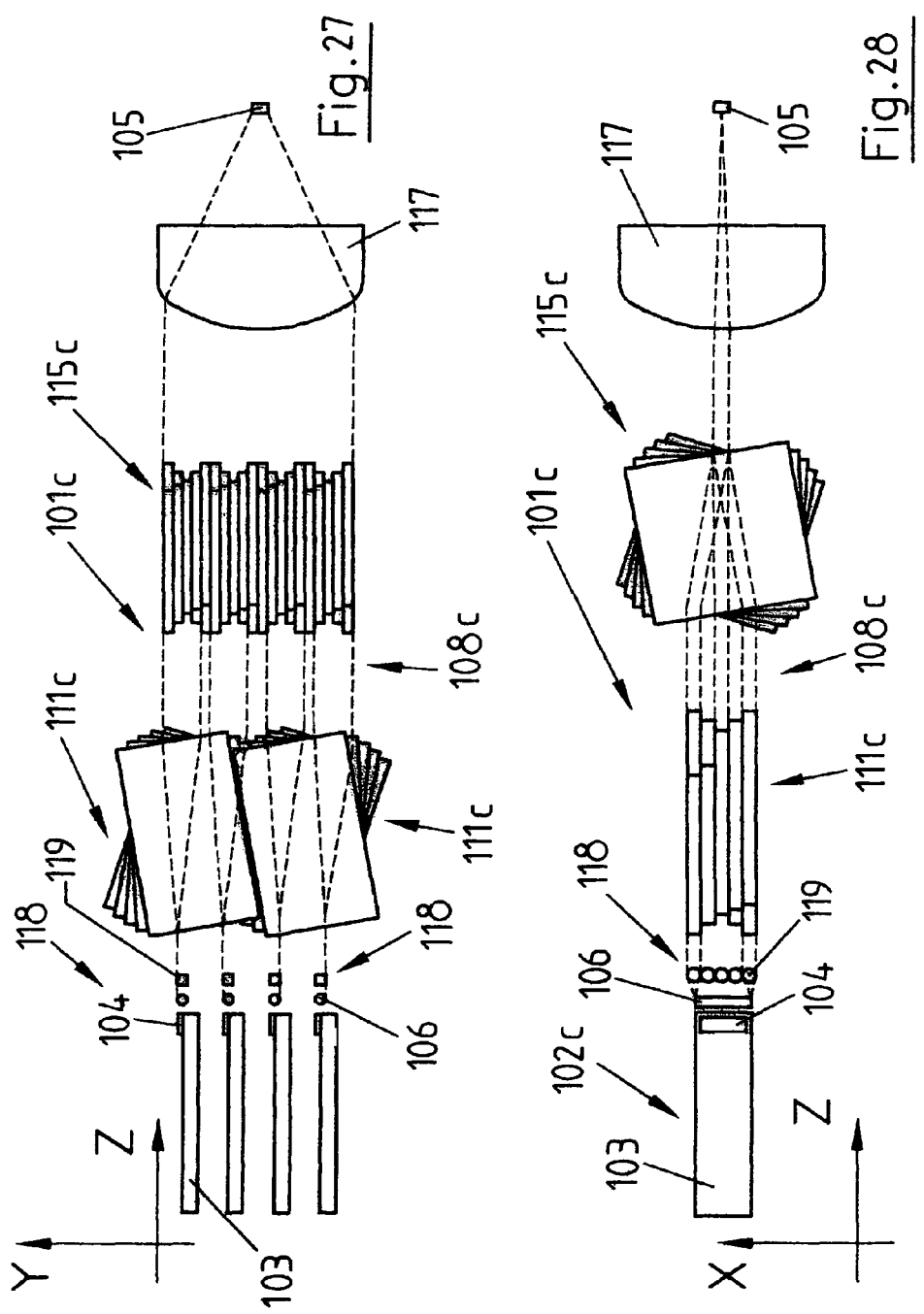

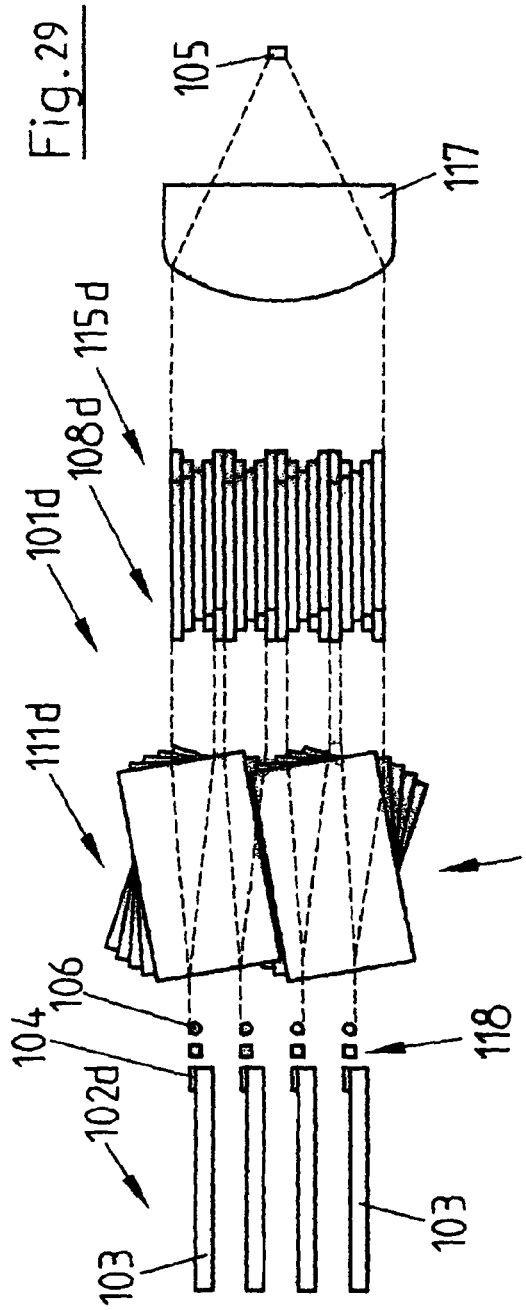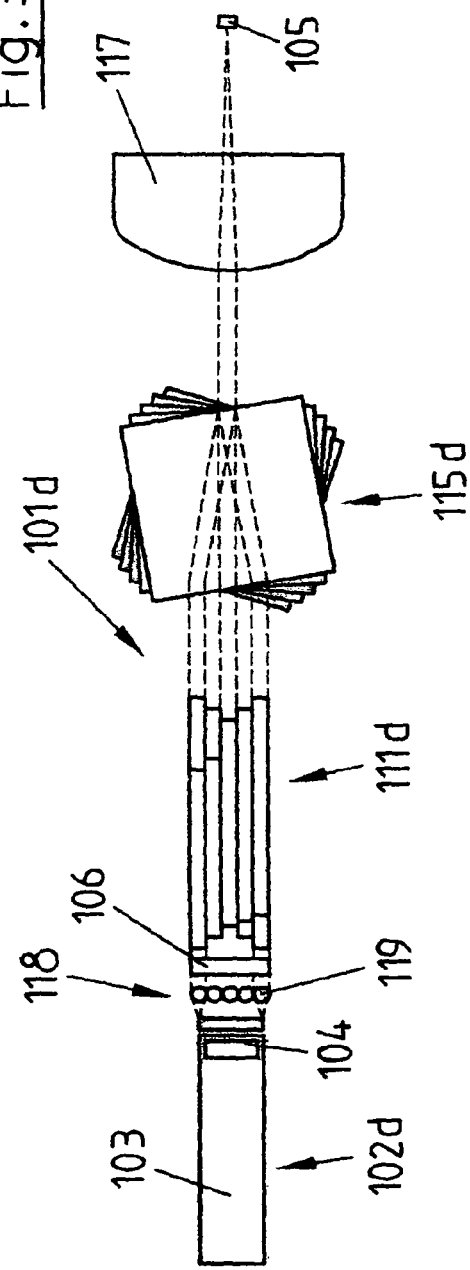

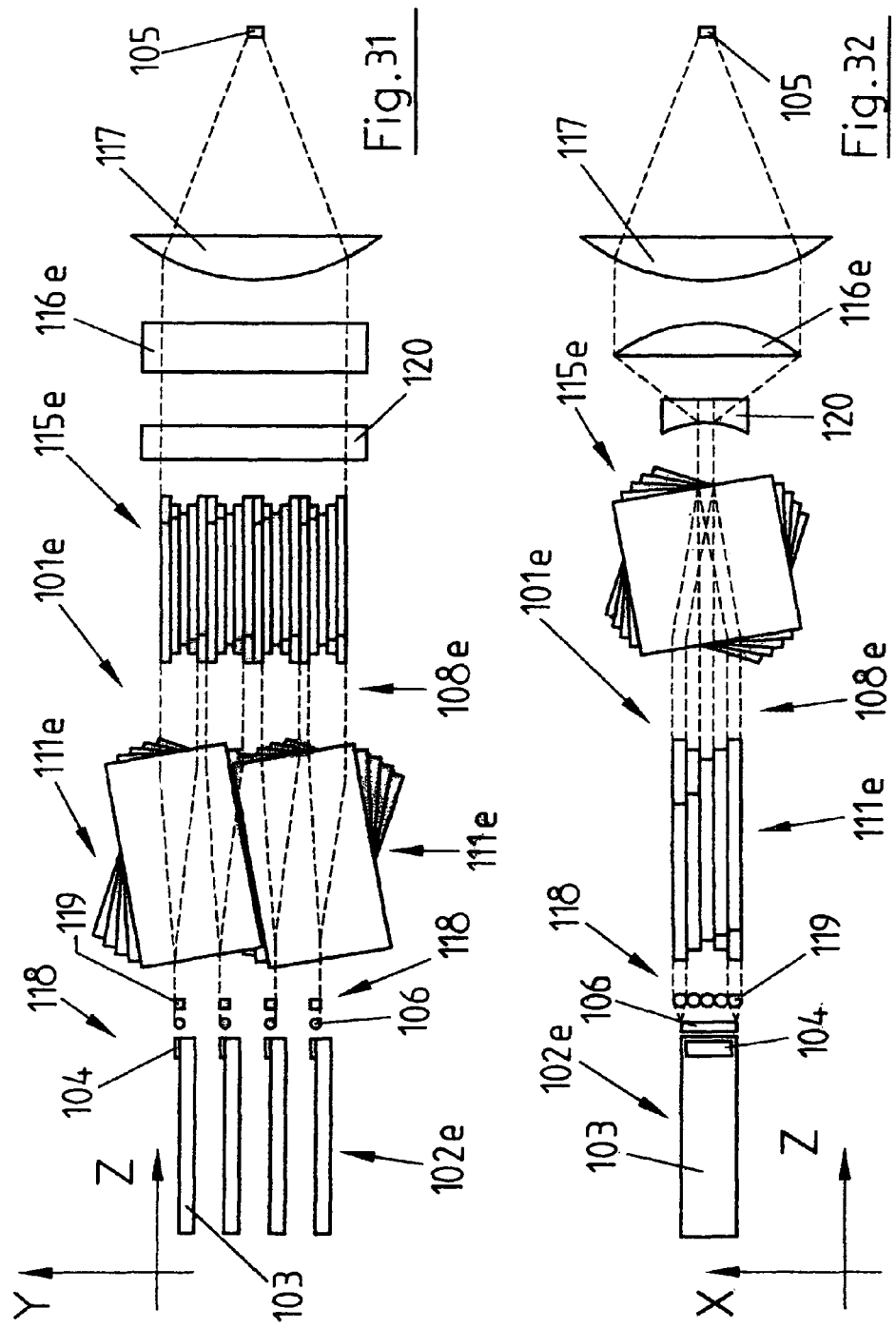

LASER OPTICS AND DIODE LASER

BACKGROUND OF THE INVENTION

The invention relates to a laser optical system and to a diode laser.

As opposed to conventional laser beam sources, which have a beam diameter of a few mm with a low beam divergence in the range of a few mrad, the beam of a semiconductor laser or diode laser (hereinafter "diode laser") is characterized by a highly divergent beam in the fast axis with a divergence >1000 mrad. This is caused by the exit layer which is limited to <1 μm in height, on which, similar to diffraction on a gap-like opening, a greater divergence angle is produced. Since the extension of the exit opening in the plane is different perpendicular and parallel to the active semiconductor layer, various beam divergences occur in the plane perpendicular and parallel to the active layer.

To achieve a power output of 20-40 W for a diode laser, numerous laser emitters are combined on what is known as a laser bar to form a laser component. Commonly, 10-50 individual emitter groups are arranged in a row in the plane parallel to the active layer. The resulting beam of such a bar in the plane parallel to the active layer has an opening angle of ca. 10° and a beam diameter of ca. 10 mm. The resulting beam quality in this plane is several times less than the resulting beam quality in the above described plane perpendicular to the active layer. Also in the event of a possible future reduction of the divergence angle of laser chips the ratio of the greatly differing beam quality perpendicular and parallel to the active layer remains.

The beam exhibits a significant difference of beam quality in the two directions perpendicular and parallel to the active layer based on the beam characteristic described above. The beam quality is defined by the $M^2$ parameter. $M^2$ is defined by the factor with which the beam divergence of the diode laser beam exceeds the beam divergence of a diffraction-limited beam with the same diameter. In the case described above, in the plane parallel to the active layer there is a beam diameter which exceeds the beam diameter in the vertical plane by a factor of 10,000. With respect to the beam divergence the behavior is somewhat different, i.e. in the plane parallel to the active layer or in the slow axis the beam divergence achieved is less by almost a factor of 10. The $M^2$ parameter in the plane parallel to the active layer is thus several orders of magnitude above the $M^2$ value in the plane perpendicular to the active layer.

A possible goal of beam shaping is to achieve a beam with nearly the same $M^2$ values in both planes, i.e. perpendicular and parallel to the active later. The following methods are currently known for shaping the beam geometry, by which an approximation of the beam qualities in the two main planes of the beam is achieved.

By means of a fiber bundle, linear beam cross sections can be combined to form a circular bundle by rearranging the fibers. Such processes are described for example in U.S. Pat. Nos. 5,127,068, 4,763,975, 4,818,062, 5,268,978 and 5,258,989.

In addition, there is the technique of beam rotation, in which the radiation of single emitters is turned by 90° in order to achieve a rearrangement, in which an arrangement of the beams in the direction of the axis of better beam quality takes place. The following arrangements are known for this process: U.S. Pat. No. 5,168,401, EP 0 484 276, DE 4 438 368. A common characteristic of all processes is that the radiation of a diode laser, after its collimation in the fast axis direction, is turned 90° in order to achieve slow axis collimation with a common cylinder optical component. In a modification of this process a continuous line source is also conceivable (for example, that of a diode laser of high surface density which is collimated in the fast axis direction) with a beam profile (line) which is divided and which is present in rearranged form behind the optical element.

In addition, it is possible to achieve rearrangement of the radiation of individual emitters without rotating the beam, rearrangement of the radiation being achieved for example by parallel offset (shifting) by means of parallel mirrors (WO 95/15510). An arrangement which likewise uses the technique of rearrangement is described in DE 195 00 53 and DE 19 5 44 488. In this case, the radiation of a diode laser bar is deflected into different planes and is individually collimated there.

The disadvantages of the existing art can be summarized in that for fiber-coupled diode lasers, usually a beam with very different beam qualities in two axial directions is coupled into the fibers. In the case of a round fiber, this means that the possible numeric aperture or the fiber diameter is not used in one axial direction. This causes significant losses in power density, so that in practical application there is a limitation to ca. $10^4$ W/cm$^2$.

Furthermore, in the known processes described above, to some extent considerable differences in the path length must be compensated. This is generally achieved by correction prisms, which can compensate for errors only to a limited extent. Furthermore, multiple reflections necessitate increased requirements for adjustment precision, production tolerances and component stability (WO 95/15510). Reflecting optical components (made of copper, for example) have high absorption values. Also known in the art is a laser optical system of the generic type for shaping at least one laser beam bundle, using at least two optical shaping elements provided consecutively in the laser beam, of which at least one shaping element is embodied as a plate fan (DE 197 05 574 A1).

It is an object of the invention is to provide a laser optical system that enables improved focusing of the laser beam.

SUMMARY OF THE INVENTION

"Diode lasers" according to the invention are understood also to be in particular also so-called single-mode lasers and/or broadband lasers and/or broadband group lasers and/or trapezoidal lasers. "Emitters" according to the invention refer in particular also to the emitters of the aforementioned lasers.

"Plate fan" according to the invention is understood to be an optical element through which laser light passes and which is made up of a plurality of plates or plate-like elements made of a light transmitting material, preferably glass, and which adjoin one another in a stack-like manner and are twisted relative to one another in a fan-like manner. Each plate or each plate-like element forms on mutually opposing sides a plate narrow side for the light entry or exit and, taking into account the arrangement of the emitters and of the divergence that the laser beams exhibit in the slow axis, is positioned and designed so that there is no reflection of the laser beam on the surface sides within the plate.

"Surface sides" according to the invention are understood to be the large plate sides, respectively.

"Plate thickness" according to the invention is understood to be the distance between the two surface sides of the respective plate.

The plate fan can be manufactured by assembly of individual plates or plate-like elements or also as one piece, for example as a molded part with corresponding optical separating or intermediate layers.

With the shaping elements provided in the light path, the laser optical system achieves a fanning out of the laser beam into single beams arranged in different planes and subsequent superimposing of these single beams one above the other.

In an embodiment of the invention at least two, but preferably more than two emitter planes with at least one emitter group respectively comprising a plurality of emitters or diodes are provided. The laser beam of each emitter group is fanned out by a first shaping element so that for each emitter group a separate partial beam group with partial beams is obtained, which are offset relative to one another in two axes extending perpendicular to the direction of transmission. The partial beam groups adjoin one another in a first axis, namely preferably without distance or space between said partial beam groups. By a second shaping element all partial beams of all groups are then superimposed one above the other by shifting in the first axis, which is also the axis in which the emitters of the emitter groups occur successively or corresponds to this axis, so that these partial beams form a common shaped laser beam, which for example has a band-like cross section with a width that corresponds to the length of the partial beams, and which can be focused in a focusing optical unit to form a focus. Preferably plate fans are used for the shaping elements.

Further embodiments, advantages and possible applications of the invention are disclosed by the exemplary embodiments and the drawings. All described and/or visually depicted characteristics are subject matter of the invention, individually or in any combination, regardless of their being summarized in the claims being referred back to. The content of the claims is also included as part of the description.

BRIEF DESCRIPTION OF THE DRAWINGS

The invention is explained below in more detail based on exemplary embodiments with reference to the drawings, in which:

FIG. 1 shows in a simplified representation a diode laser, consisting of a laser diode arrangement comprising a plurality of laser elements or laser chips and an optical arrangement formed by two plate fans located in the beam path of this laser diode arrangement, the drawing plane of this figure being perpendicular to the active layer of the diode elements;

FIG. 2 shows the diode laser of FIG. 1, the drawing plane of this figure being parallel to the active layer of the diode elements;

FIGS. 3 and 4 show in a simplified representation the embodiment of the laser beam before, during and after shaping;

FIGS. 7 and 8 show a diode laser similar to the diode laser of FIGS. 1 and 2, however with a focusing optical unit located in the beam path following the two plate fans and consisting of a cylinder lens and a spherical focusing lens, the drawing plane of FIG. 7 being perpendicular to the active layer and the drawing plane of FIG. 8 being parallel to the active layer of the diode elements;

FIGS. 11-18 show in general arrangement drawings various diode laser bars;

FIGS. 22 and 23 show in representations similar to FIGS. 19 and 20 a further possible embodiment of the invention;

FIG. 24 shows in Positions a, b and c respectively in a simplified representation the embodiment of the laser beam at different positions within the laser optical system of FIGS. 22 and 23; and FIG. 25-32 show diode lasers of further embodiments of the invention.

DETAILED DESCRIPTION OF THE INVENTION

Figure 5:
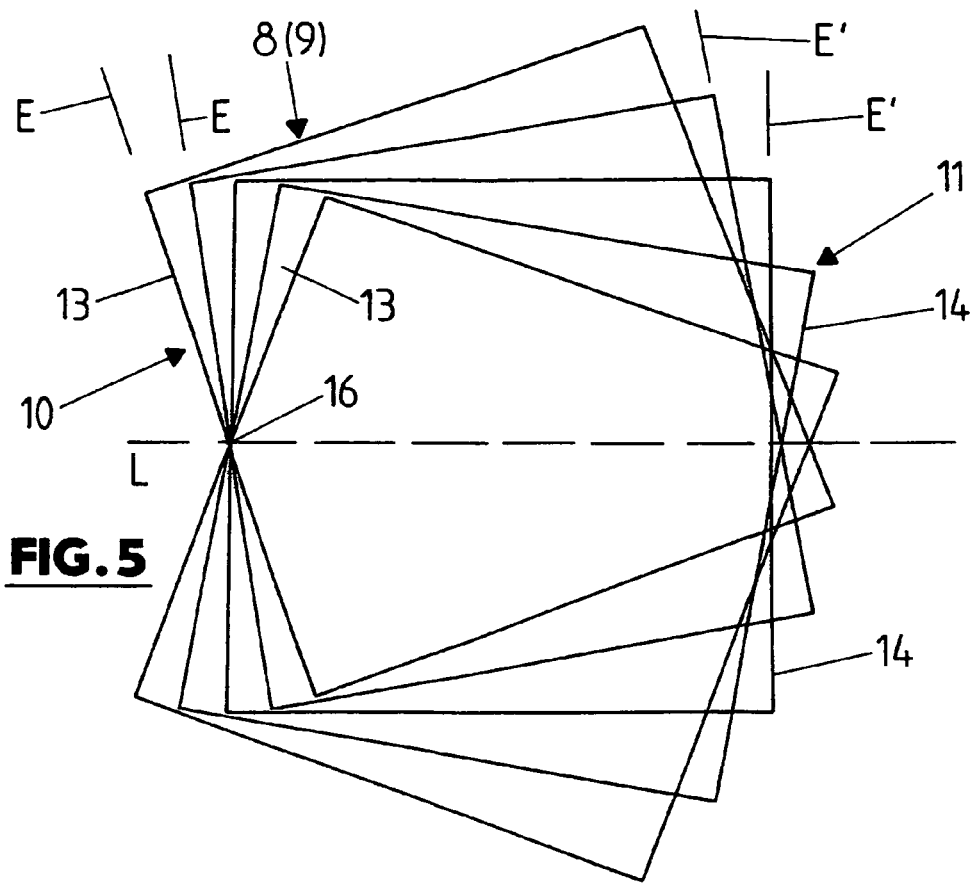
FIGS. 5 and 6 show one of the optical plate fans in side view and in top view.

In the drawings, for clarity of illustration, spatial axes extending perpendicular to one another are designated X, Y and Z, namely the X axis, Y axis and Z axis. The drawing plane for example of FIGS. 1, 7, 9 and 19 is accordingly in the Y-Z plane defined by the Y axis and the Z axis, the drawing plane for example of FIGS. 2, 8, 10 and 20 is in the X-Z plane and the drawing plane of FIG. 3 is in the X-Y plane.

The diode laser 1 depicted in FIGS. 1 and 2 consists essentially of a laser diode arrangement 2, which comprises on a substrate 3 designed among others as a heat sink a laser bar 4 with a plurality of emitters 4.1 emitting laser light, which (emitters) are oriented in the same direction and especially also with their active layers lie in a common plane perpendicular to the drawing plane of FIG. 1 or parallel to the drawing plane of FIG. 2, i.e. in an X-Z plane which is defined by the X axis and Z axis indicated in the drawings.

In the beam path of the laser beam being emitted by the laser bar 4 in the form of a beam bundle consisting of individual beams 5 there is a fast axis collimator 6, which for example consists of a cylinder lens lying with its axis in the X axis and effects collimation of the laser beam or of the individual beams 5 in their so-called fast axis, i.e. in the Y axis and therefore in the Y-Z plane perpendicular to the active layer, in which the radiation of the emitters 4.1 of the laser bar 4 exhibit the greater divergence. Downstream from the fast axis collimator 6 the laser beam is present essentially as a narrow-band beam bundle made up of the individual beams 5, as indicated in FIG. 3.

Downstream from the fast axis collimator 6 in the beam path of the laser beam there is an optical apparatus 7 for further shaping of the laser beam bundle, namely for example in that the beam bundle (FIG. 3—Position a) is first separated or fanned out into individual beams 5' in various planes parallel to the X-Z plane which are offset relative to one another from plane to plane also in the X axis (FIG. 3—Position b) and these individual beams 5' are then superimposed diagonally one above the other as schematically shown in FIG. 4 by 5".

The optical apparatus 7 consists for this purpose of two plate fans 8 and 9, which in the depicted embodiment are basically identical, however arranged twisted 90° on the Z axis on both sides of an imaginary middle plane intersecting the Z axis perpendicularly so that both plate fans with a similarly designed fan side 10 respectively face away from this middle plane and with a similarly designed fan side 11 face toward this middle plane. The design of the plate fan 8 is depicted in detail in FIGS. 5 and 6 by way of example. The plate fan 9 is designed in the same manner so that the following description also applies to this plate fan.

Figure 6:
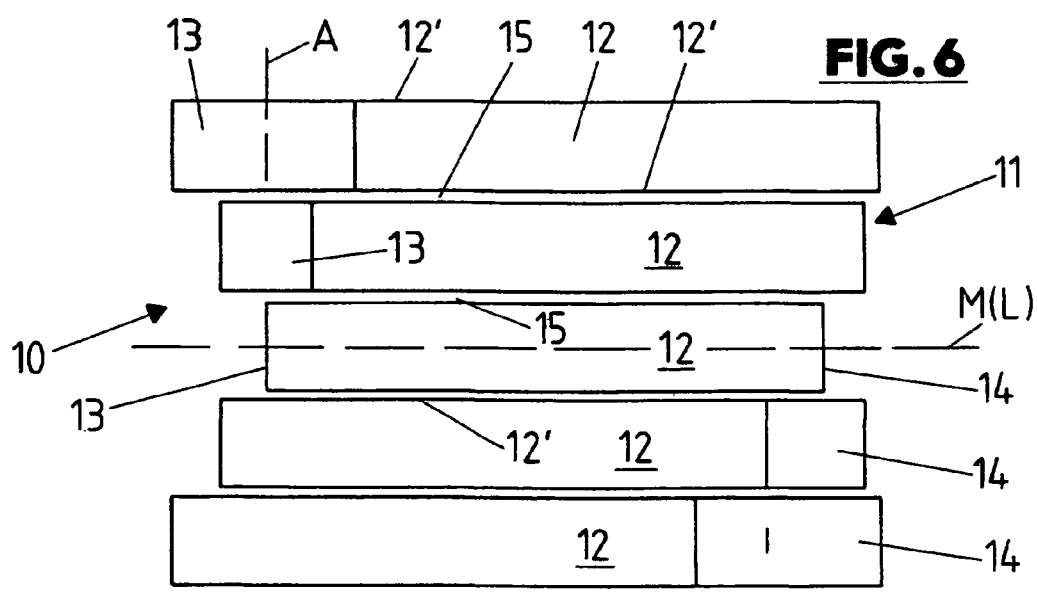

The plate fan 8 consists of several thin plates 2, which are manufactured from a light transmitting material, for example glass, and in the depicted embodiment have a square cross section respectively. Each plate 12 has two flat plate narrow sides 13 and 14 which form the sides for the entry and exit of the laser beams and for this purpose are designed of high optical quality, i.e. are polished and provided with an anti-reflection layer. The two sides 13 and 14 are opposite one another on each plate 12 and in the depicted embodiment are arranged parallel to one another. In the depiction of FIGS. 5 and 6 it is assumed that the plate fan 8 consists of a total of five plates 12. Theoretically, it is also possible to have fewer or more than five plates 12.

The plates 12 adjoin one another with their surface sides 12', on which they are likewise polished, in a stack-like manner, a gap 15 being provided respectively between two adjacent plates 12 and which is filled with a medium that has a smaller optical refraction index than the material of the plates 12. The gap 15 is for example an air gap, but preferably the respective gap 15 is filled with a material that connects the plates 12, for example with optical cement.

The plates 12 are offset relative to one another in a fan-like manner. In the depicted embodiment the plates 12 for this purpose are twisted relative to one another on a common fan axis A, and in addition a pre-defined area 16 of the plate narrow side 13, namely in the depicted embodiment the middle of each plate narrow side 13 of each plate 12 together with the corresponding areas 16 of the remaining plates, lies on the common axis A, which is perpendicular to the planes of the surface sides 12' of the plates 12 and therefore also perpendicular to an imaginary middle plane M of the plate fan 8 arranged parallel to these surface sides. Around the axis A or around its areas 16 the individual plates 12 are twisted relative to one another in a fan-like manner or fanned out so that the planes E of the plate narrow sides 13 of two adjacent plates intersect in the axis A and enclose with one another an angle α, which is depicted exaggeratedly large in FIG. 5 and for example is on an order of magnitude of 1-5°. The middle plate 12 lies with plane E of its plate narrow side 13 perpendicular to a longitudinal extension L or optical axis of the plate fan 8. The entirety of the plate narrow sides 13 of all plates 12 forms the plate fan side 10. Corresponding to the arrangement of the plate narrow sides 13 the plate narrow sides 14, which in their entirety form the plate fan side 11, are also arranged relative to one another so that the planes E' of two adjacent plate sides 14 likewise enclose with one another the angle α. The planes E and E' of the plate narrow sides 13 and 14 are perpendicular to the planes of the surface sides 12'.

The plate fan 8 is further designed so that the plates adjoining the middle plate 12 respectively are symmetrically twisted or fanned out, i.e. for the depiction chosen for FIG. 5, the plates 12 provided on the a plate narrow side of the middle plate 12 are twisted with their plate narrow sides 13 counter-clockwise and the adjoining plates on the other plate narrow side of the middle plate 12 are twisted with their plate narrow sides 13 clockwise relative to the middle plate.

The width of the respective gap 15 is as small as possible, but sufficiently large (e.g. several 1/100 mm) to ensure that also in the case of slight warping of one or more plates 12, there is no direct contact between two adjacent plates 12, therefore preventing radiation loss which could occur at such points of contact and therefore reduce the efficiency of the system.

The plate fan 8 in the diode laser 1 is arranged so that it lies with its longitudinal axis L in the Z axis and the middle axis in the Y-Z plane, the plate fan side 10 facing toward the laser diode arrangement 2, so that the beam bundle from the laser beams 5 enters this plate fan on the plate fan side 10. The plate fan 9 is arranged with its longitudinal axis L, which is perpendicular to the plate narrow side 13 of the middle plate 12 and intersects the axis A perpendicularly, likewise in the Z axis, namely on the same axis with the axis L of the plate fan 8, the plate fan side 11 of the plate fan 9 facing toward the plate fan side 11 of the plate fan 8. The middle plane M of the plate fan 9 lies in the X-Z plane so that the plate fan 9 is twisted 90° on the Z axis relative to the plate fan 8.

A special characteristic of the laser optical arrangement 7 is firstly that on the plate fan 8 which is downstream from the fast axis collimator 6 in the beam path, each emitter 4.1 of the laser bar 4 is allocated a separate plate 12, namely so that the laser beam 5 of each emitter 4.1 collimated in the fast axis collimator 6 is approximately centered and perpendicularly impinges the flat plate narrow side 13 facing toward this emitter, the axis distance between the emitters 4.1 in the slow axis of the laser beams 5, i.e. in the depiction in FIGS. 1 and 2 in the X axis, is equal to the distance between the middle planes of two adjacent plates 12 oriented parallel to the surface side 12'.

Further, the plate thickness (distance of the surface sides 12') of each plate 12 is at least equal to, but preferably greater than the divergence of the laser beam 5 of the corresponding emitter 4.1 in the slow axis, i.e. in the depiction chosen for FIGS. 1 and 2, in the X axis, namely at the point of exit of the respective plate, i.e. on the plate front side 14. This ensures that no reflections (total reflections) of the respective laser beam 5 occur within the corresponding plate 12 in the area of the surface sides 12' and each individual beam 5.1 emitting from the plate fan 8 is point-like or essentially point-like.

Analogously, the adjoining plate fan 9 in the beam path is then designed for example so that each laser beam 5' emitting from a plate 12 of the plate fan 8 is allocated a plate 12 of the plate fan 9, however in any case the plate thickness of the plates 12 of the plate fan 9 are at least equal to or greater than the divergence of the individual beams 5.2 collimated by the fast axis collimator 6 at the point of exit from the plate fan 9 in this fast axis, i.e. in the depiction chosen for FIGS. 1 and 2, in the Y axis.

Fundamentally it is also possible to design at least the plate fan 8 in deviation from the ideal embodiment described above so that one plate 12 is provided jointly for one emitter group with a smaller number of emitters, for example for two or a maximum of three emitters 4.1, respectively, namely for example if the distance between the emitters 4.1 in the slow axis, i.e. in the X axis, is smaller or equal to the divergence of the laser beams 5 in the slow axis. Also in this case the arrangement is made and the plate thickness chosen so that none of the laser beams of the emitters 4.1 is subject to a reflection within the corresponding plate 12 in the area of the surface sides 12.1, the plate thickness of each plate 12 is therefore equal to the sum of the distance between the emitters 4.1 of the respective emitter group and of the divergence which these emitters or their laser beams 5 exhibit in the slow axis.

The length of the respective emitter bar in the direction of the slow axis, i.e. in the direction of the X axis, is for example 10 mm. The distance between the individual emitters 4.1 on the laser bar 4 is then for example greater than 1 mm and less than 3 mm. The number of plates 12 of the plate fan 8 is for example between three and ten plates.

The laser beam 5 collimated by the fast axis collimator 6 impinges the plate fan side 13, namely in the area of the axis A or the longitudinal axis L.

Due to the different inclination of the plate narrow sides 13 and of the plate sides 14 the incident laser beam bundle is separated into the different individual beams 5', which exit from the plate fan 8 parallel or essentially parallel to the Z axis on the plate sides 14, the individual beams 5' being arranged in different planes parallel to the X-Z plane due to the refraction on the plate narrow sides 13 and 14.

The single individual beams 5' then enter the plate fan 9 on a plate side 14 respectively. Due to the refraction on the plate narrow sides 13 and 14 all individual beams 5' exit on the plate narrow sides 13 of the plates 12 of the plate fan 9, namely in the area of the axis A which is parallel to the Y axis there, so that the individual beams 5' are arranged diagonally offset one above the other, as depicted in FIG. 4.

FIGS. 7 and 8 show a diode laser 1a, which differs from the diode laser 1 only in that in the beam path downstream from the optical arrangement 7, a slow axis collimator 17 is provided in the form of a cylinder lens, which is oriented with its axis parallel to the Y axis. Due to these collimator 17 the divergence exhibited by the individual beams 5' in the slow axis, i.e. in the X axis, is corrected, so that afterwards several collimated individual beams 5" exist one above the other in the direction of the Y axis and are focused by means of the focusing optical unit, i.e. by means of the spherical focusing lens 18.

Figure 9:
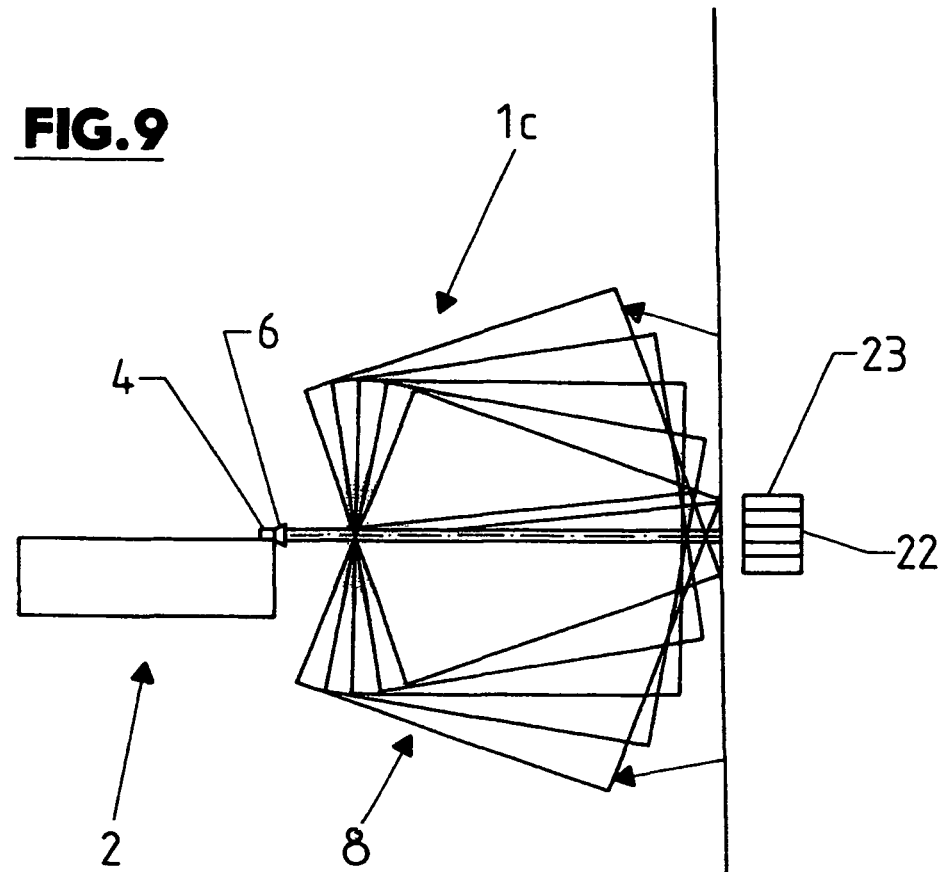
FIGS. 9 and 10 show in a representation similar to FIGS. 1 and 2 a further possible embodiment, in which only one plate fan and adjoining the latter one step mirror are provided in the beam path.
Figure 10:
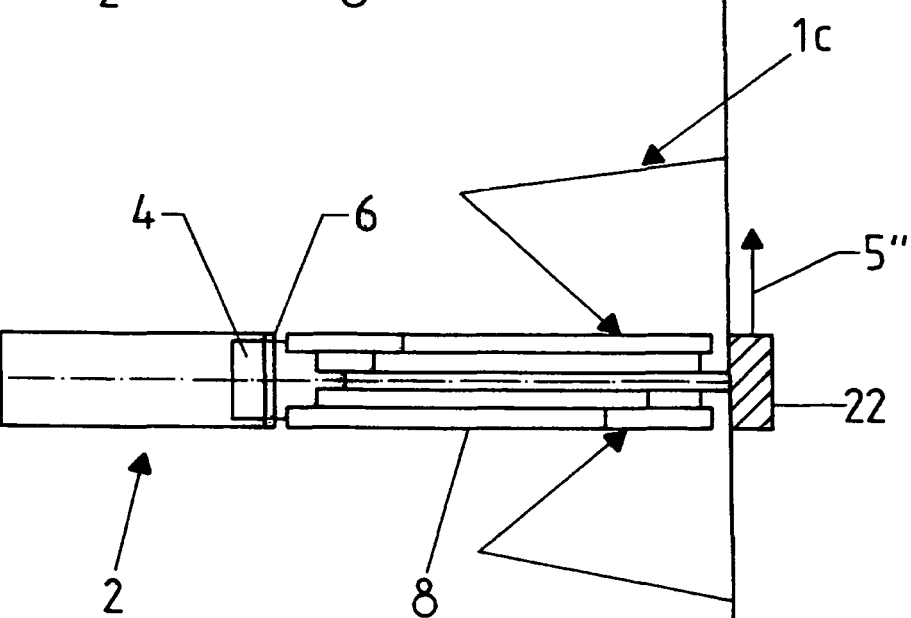

FIGS. 9 and 10 show as a further possible embodiment a diode laser 1c, which differs from the diode laser 1 of FIGS. 1 and 2 only in that instead of the second plate fan 9 in the beam path for diagonal pushing together of the beam bundle of the individual beams 5' (Position b in FIG. 3) to form the beam bundle of the individual beams 5" (FIG. 4) a so-called step mirror 22 is provided. Said mirror has a plurality of mirror surfaces 23, which are offset relative to one another so that due to reflection on the mirror surfaces the shaping of the beam bundle of the individual beams 5' to form the beam bundle of the individual beams 5" is effected.

The plate fan 8 also in the embodiment depicted in FIGS. 9 and 10 is likewise designed in the same manner as described above for the plate fan 8 of FIGS. 1 and 2. All embodiments of the invention therefore have in common that at least the first plate fan 8 located in the beam path is arranged and designed with respect to its plates 12 so that the individual or laser beams 5 of the laser beam bundle entering on the plate narrow side 13 exit as individual beams 5.1 without reflection, in particular also without total reflection within the respective plate on the narrow side 14 of this plate.

The diode laser 1 or its laser arrangement 2 were described above in general as consisting of a substrate 3 designed as a heat sink and of a laser bar 4 with a plurality of emitters 4.1 emitting laser light. Especially the respective laser bar 4 can be designed in many different ways.

For example, FIGS. 11 and 12 show in a simplified perspective representation (FIG. 11) and in an enlarged partial representation (FIG. 12) a laser bar 4, which is designed as a single-mode laser bar, namely with five emitters 4.1 in the form of single-mode emitters. The typical width of the emitters 4.1 in the slow axis (X axis) of their laser beams is approximately 2-5 µm and the distance between two consecutive emitters 4.1 in the slow axis (X axis) is approximately 1-3 mm. The laser bar 4 has for example a length of approximately 10 mm in the X axis and a width of approximately 2 to 4 mm in the Z axis. With each emitter 4.1 it is possible to achieve a power output of up to 1 W.

FIGS. 13 and 14 show a laser bar 4, which is designed as a broadband laser bar, namely in the depicted embodiment with a total of five emitters 4.1 in the form of broadband emitters. The width of the emitters 4.1 in the direction of their slow axis (X axis) is between approximately 50 and 500 µm. The distance between the individual emitters 4.1 in the slow axis (X axis) is for example greater than the above-mentioned width of the emitters 4.1. The laser bar 4 has for example a length of approximately 10 mm in the X axis and a width of approximately 2 to 4 mm in the Z axis. With each emitter 4.1 it is possible to achieve a power output of up to 20 W.

FIGS. 15 and 16 show a laser bar 4 in the form of a broadband group laser bar with a total of five groups of emitters 4.1, which are respectively designed as broadband emitters. In the depicted embodiment each emitter group has a total of three emitters 4.1. In practice, embodiments are possible in which the number of emitters 4.1 in each broadband emitter group can deviate from this, each broadband emitter group having for example two to five emitters 4.1. Regardless of the number of emitters 4.1 the total width of each emitter group in the X axis is then approximately 200 to 600 µm. The laser bar 4 has for example a length of approximately 10 mm in the X axis and a width of approximately 2 to 4 mm in the Z axis. With the individual broadband emitter groups it is possible to achieve power outputs of up to 30 W.

FIGS. 17 and 18 show a laser bar 4, which is designed as a trapezoidal laser bar with five emitters 4.1 in the form of trapezoidal laser emitters. On their laser light exit opening on the front side of the laser bar 4 in the direction of the slow axis (X axis) the emitter 4.1 have a width between 100 and 400 µm, namely in the case of an axis distance of the individual emitters 4.1 for example on the order of between 1 mm and 3 mm. The individual emitters 4.1 are designed so that in activated within the laser bar 4 state they form a slightly diverging beam toward the front side of said bar, namely with a divergence angle of approximately 2 to 6° and starting from a beam point which is offset relative to the front side of the laser bar 4 by approximately 2 to 5 mm in the Z axis toward the back side of the laser bar and is at a distance of approximately 400 to 1000 µm from the latter, as indicated in FIG. 17 by the intermittent line. With the emitters 4.1 it is possible to achieve a respective power output of up to 10 W with this embodiment. Especially with the laser bar 4 designed as a trapezoid laser it is possible to achieve an especially high brilliance for the diode laser with the laser optical system described above.

The height of the emitters 4.1 in the fast axis (Y axis) in the case of the bar 4 described above is 1 µm.

Figure 19:
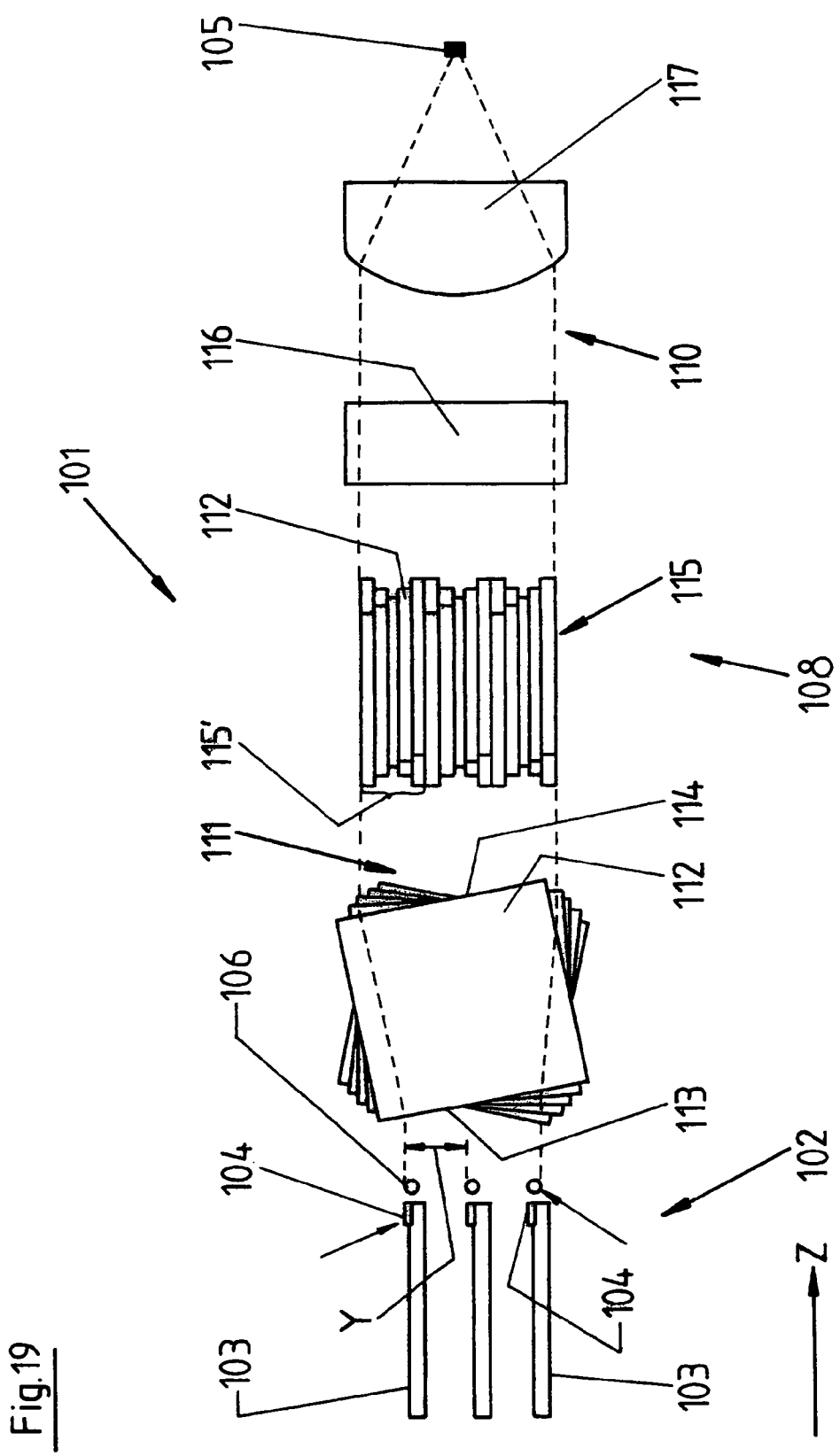
FIG. 19 shows in a simplified representation a diode laser consisting of a laser diode arrangement comprising a plurality of laser chips or laser bars and a laser optical element for shaping the laser beams, the drawing plane of this figure being perpendicular to the active layer of the laser bars.
Figure 20:
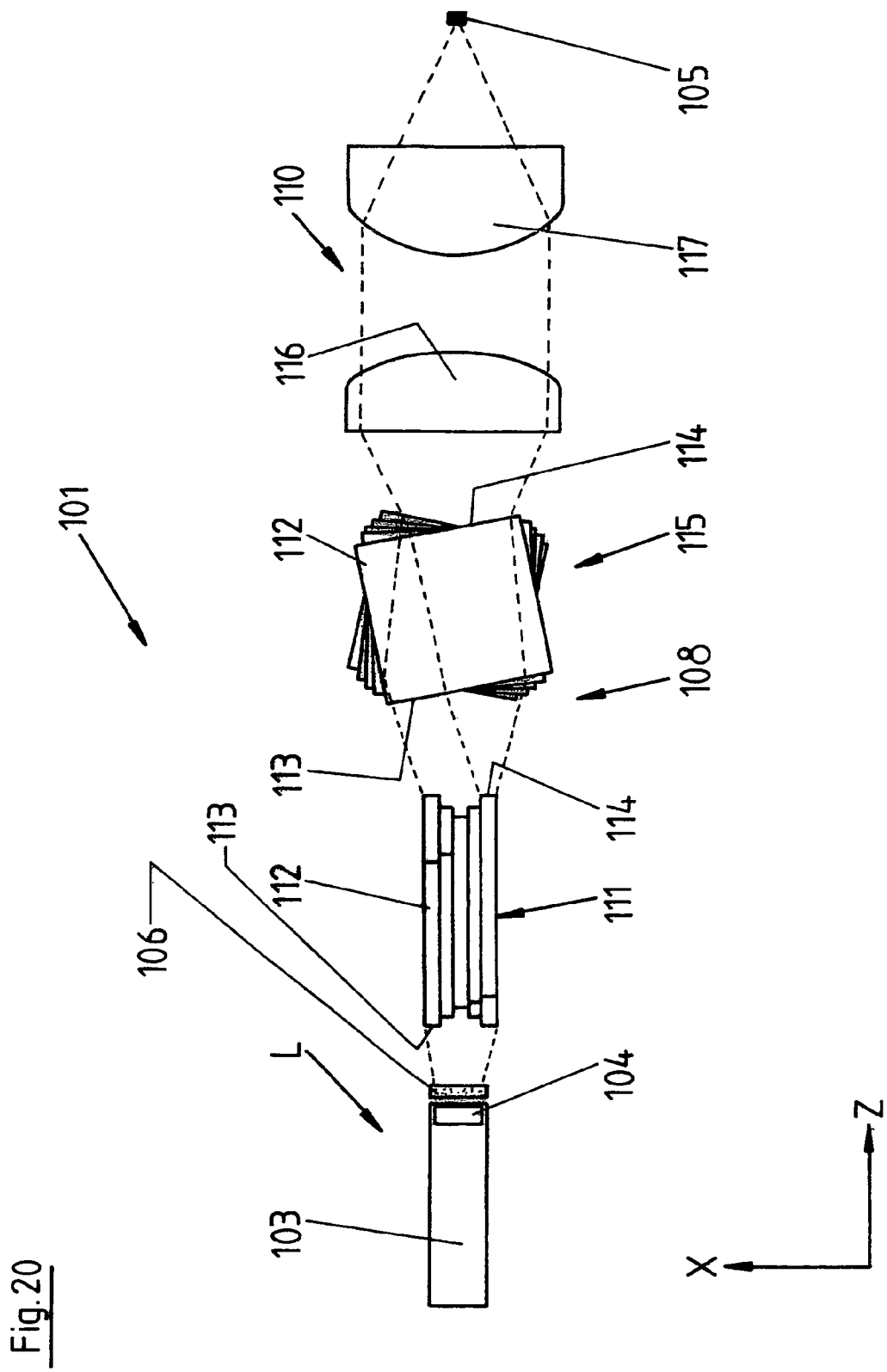
FIG. 20 shows the diode laser of FIG. 19, however in a representation in which the drawing plane of this figure is parallel to the active layer of the diode elements, the depiction of the divergence of the laser beams in the slow axis being exaggerated for reasons of clarity and better illustration.
Figure 21:
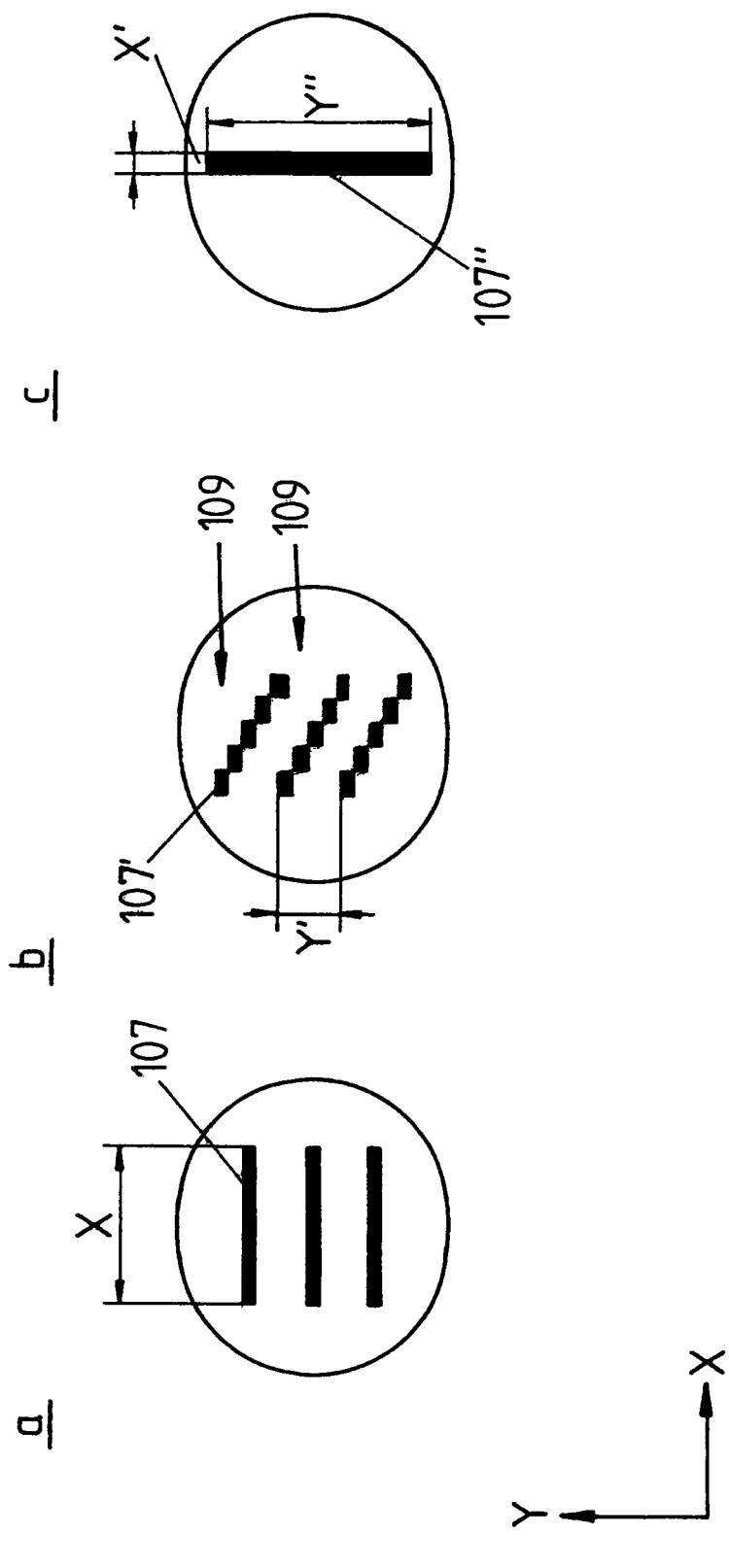
FIG. 21 shows in Positions a, b and c respectively in a simplified representation the embodiment of the laser beam at different positions within the laser optical system of FIGS. 19 and 20.

The diode laser 101 depicted in FIGS. 19-21 consists essentially of a diode laser arrangement 102 which comprises several laser components or bars 104 provided on a substrate 103 designed for example as a heat sink. Each laser bar 104 has a plurality of laser light emitting diode elements or emitters which are oriented in the same direction and offset relative to one other in each laser bar 104 in the direction of the X axis and in particular also lie with their active layers in a common plane perpendicular to the drawing plane of FIG. 19 or parallel to the drawing plane of FIG. 20, i.e. in the depiction chosen for the drawings in the X-Z plane.

Further, the laser bars 104 are parallel to one another and at a distance from one another by a pre-defined amount y in the direction of the Y axis. This distance results among others as a result of the design due to the thickness of the substrate 103 in this axis direction.

The diode laser 101 further comprises the laser optical unit 108 described in more detail below with which the laser beam of the individual laser bars 104 is focused to form a common focus 105. This laser optical unit 108 comprises among others fast axis collimators 106, one of which is allocated respectively to each laser bar 104 and which respectively effect a collimation of the laser beam 107 of the corresponding laser bar 104 in the fast axis, i.e. in the Y axis and therefore in the Y-Z plane perpendicular to the active layer, in which the laser beam of the emitters of the respective laser bar 104 exhibits the greater divergence. In the depicted embodiment the fast axis collimators 106 are formed respectively by a microlens, namely by a cylinder lens which lies with its axis in the X axis. After passing through the fast axis collimator 106 the laser beam 107 of each laser bar is present essentially as a narrow band beam, the greater dimension x of which lies in the X axis, as shown in Position a in FIG. 21.

Downstream from the fast axis collimators 106 in the direction of the optical axis (Z axis) the laser optical unit 108, in the beam path of the laser beams 107, comprises an optical arrangement for further shaping of the laser beams, namely in that in a first shaping element, which is provided jointly for the laser beams 107 of all laser bars 104, each laser beam 107 is first separated into partial beams 107', which are fanned out in various planes parallel to the X-Z plane and are offset relative to one another from plane to plane in the X axis, as depicted in Position b in FIG. 21. This depiction also shows that the partial beams 107' of each laser bar 104 respectively form a partial beam group 109 of fanned out partial beams 107', the number of groups 109 being equal to the number of laser bars 104 or of the emitter planes of the laser diode arrangement 102 in which the laser bars 104 are arranged. Each group 109 further has a height y' corresponding to the distance y in direction of the Y axis. Further, the groups 109 adjoin one another directly in the depicted embodiment, i.e. the distance between the plane of the last partial beam 107' of a group 109 and the plane of the first partial beam 107' of the next group 109 is equal to or essentially equal to the distance between the planes of the partial beams 107' within each group 109. The dimension x' of the partial beams 107' in the groups 109 in the X axis is equal to or approximately equal to the dimension x divided by the number of partial beams 107' of each group 109.

In the depicted embodiment each laser beam 107 is fanned out into five partial beams 107', so that in the case of a total of three groups, a total of fifteen partial beams 107' is produced.

In a next step, shaping of the partial beams 107' is achieved in the laser optical unit 108 so that these partial beams 107' are superimposed one above the other in their X-Z plane, so that the partial beams 107' are congruent and form a shaped band-like laser beam 107'', as indicated in Position c in FIG. 21. This laser beam 107'' then has its larger dimension y'' in the direction of the Y axis and corresponds to the height y' multiplied by the number of groups 109. The width of the laser beam 107'' is equal to the dimension x' of the partial beams 107'. The band-like laser beam 107'' is then subsequently focused in a focusing arrangement 110 to form the focus 105.

The principle of beam shaping described above features, among others, the advantage that the laser radiation of a plurality of laser bars 104 which are provided in the laser diode arrangement 102 offset relative to one another in direction of the Y axis can be focused to form the common focus 105, so that high power density is possible combined with high beam quality, making use of the unavoidable distance y between the individual planes in which the laser bars 104 are provided, this distance being necessitated by the design. A further advantage is that the laser optical unit 108 and in particular also its shaping elements can be realized very easily and therefore also economically.

As the first shaping element, the laser optical unit 108 in the beam path downstream from the fast axis collimators 106 contains a first plate fan 111, which is manufactured from a plurality of thin plates 112 made of a light transmitting material, for example glass. In the depicted embodiment each plate 112 has a square layout. Each plate 112 has two flat plate sides 113 and 114 which are designed of high optical quality, i.e. are polished and provided with an anti-reflection layer and of which the narrow side 113 forms the entry point of the light and the narrow side 114 forms the exit point of the light. The plates 112 adjoin one another with their surface sides, which are likewise polished, in a stack-like manner. Between adjacent plates 112 air, for example, or a medium is provided, which connects the plates and at the same time ensures a total reflection of the laser light within the plates 112 on their surface sides. The plates 112, which are arranged with their surface sides respectively in the Y-Z plane, are twisted in a fan-like manner or fanned out relative to one another on at least one fan axis, namely so that the planes of the plate narrow sides 113 or 114 of two adjacent plates enclose an angle with one another, which for example is on the order of magnitude of 1 to 5°. The individual plates 112 are twisted relative to one another respectively from plate to plate in the same direction around the fan axis. The thickness of the plates 112 is for example 1. The plates 112 effect the fanning out of the laser beams 107 of all laser bars 104 to form the partial beams 107' or to form individual groups 109, the number of plates 112 determining the number of partial beams 107' in each group 109, i.e. in the depicted embodiment the plate fan 111 has a total of five plates 112. The embodiment and arrangement of the plate fan 112 are further chosen so that the middle plane of the plate fan 111 lying parallel to the surface sides of the plates 112 coincides with the Y-Z middle plane of the laser beams 107 and further that the plane in which the at least one fan axis lies is an X-Z plane, namely the middle or symmetrical plane of all laser beams 107 emitting from the laser diode arrangement 102.

For shaping of the partial beams 107' to form the laser beam 107'' a further plate fan 115 is provided in the beam path downstream from the plate fan 112. This plate fan 115 consists of several individual plate fans 115', which adjoin one another in the direction of the Y axis, the number of individual plate fans 115' being equal to the number of groups 109 and therefore equal to the number of planes in which laser bars 104 are provided in the laser diode arrangement 102. In the depicted embodiment therefore the plate fan 115 has three individual plate fans 115'. Each individual plate fan 115' in turn consists of several plates 112, which adjoin one another in a stack-like manner and are twisted relative to one another in a fan-like manner, namely on at least one fan axis, i.e. each individual plate fan 115' is designed essentially as described above for the plate fan 111.

The plates 112 of the individual plate fans 115, however, are arranged with their surface sides in the X-Z plane, i.e. in a plane which is twisted on the Z axis 90° relative to the plane of the plates 112 of the plate fan 111. The number of plate fans 112 in each individual plate fan 115' is equal to the number of partial beams 107' in each group 109 and therefore equal to the number of plates 112 in the plate fan 111. The plate fan 115 can therefore in principal be manufactured using the same plates 112 as the plate fan 111. In a corresponding further embodiment it is also possible to achieve the plate fans 115 by stacking several plate fans 111 one above the other.

The number of plates 112 in the plate fan 115 is therefore equal to the number of plates 112 in the plate fan 111 multiplied by the number of planes in which laser bars 104 are provided in the laser diode arrangement 102 offset relative to one another in the Y axis.

While the fan-like arrangement of the plates 112 in the plate fan 111 effects the fanning out of the laser beams 107 to form the partial beams 107' of each group 109, the partial beams 107' in the X axis are superimposed one above the other and shaped to form the beam 107" by the plate fan 115.

The focusing arrangement 110 in the depicted embodiment is formed by a cylinder lens 116, which is downstream from the plate fan 115 and effects a collimation of the beam 107" in the slow axis, i.e. in the X axis, so that in the beam path downstream from the cylinder lens 116 there is an essentially parallel radiation which is then focused with the focusing lens 117 to form the focus 105.

Time delays, in particular also in the partial beams 107' can be compensated by shifting the individual plates 112 of the respective plate fan relative to one another in the optical axis or by different dimensions of the plates 112 (distance between the front faces 113 and 114).

FIGS. 22 and 23 show as a further possible embodiment a diode laser 101a, which differs from the diode laser 101 essentially only in that the laser diode arrangement 102a has a larger number of laser bars 104, namely a total of four laser bars 104, the first shaping element of the laser optical unit 108a being formed by two plate fans 111, of which one plate fan 111 is allocated to two laser bars 104 or emitter planes (X-Z planes) respectively. The two plate fans 111 are of identical design in the laser optical unit 108a.

With the corresponding number of laser bars 104 or laser beams 107 (also FIG. 24, Position a) in this embodiment due to the two plate fans 111, a total of four groups 109 of fanned out partial beams 107' are formed (FIG. 24, Position b), and the second shaping element, i.e. the plate fan 115a forming this second shaping element, also has a total of four individual plate fans 115'. The number of plates 112 in the plate fan 115a is likewise equal to the number of laser bars 104 or emitter planes multiplied by the number of partial beams 107' of each partial beam group 109, i.e. multiplied by the number of plates 112 of one of the two plate fans 111.

For the sake of clarity in the above description it was assumed that a laser bar 104 is provided in each plane of the laser diode arrangement 102 or 102a. Generally it is also possible to provide several such bars successively in the X axis in each plane and/or to use two or more than three such planes.

FIGS. 25 and 26 show as a further possible embodiment a diode laser 101b, which differs from the diode laser 101 essentially only in that the slow axis collimation does not take place by the cylinder lens 116 provided in the beam path downstream from the second plate fan 115b, but rather by a microlens array 113 which is provided in the beam path directly upstream from the first plate fan 111b.

The laser optical unit generally designated 108b in FIGS. 25 and 26 therefore comprises the following elements, which—based on the laser diode arrangement 102b corresponding to the laser diode arrangement 102a—adjoin one another in the following order:

fast axis collimators 106, namely one respectively for each emitter plane or for each laser bar 104;

microlens array 118 for slow axis collimation;

plate fan 111b, which corresponds to plate fan 111 in design and arrangement;

plate fan 115b, which corresponds to plate fan 115 and focusing element or focusing lens 117.

The microlens array 118 in the depicted embodiment consists of a plurality of optical elements functioning as cylinder lenses, or cylinder lenses 119 which are oriented with their axis in the Y axis, i.e. perpendicular to the active layer of the emitters of the laser bars 104. The cylinder lenses 119 are arranged so that several cylinder lenses 119 adjoin one another respectively in a row in the direction of the X axis and hereby preferably are combined to form a lens element. Each laser bar 104 or each emitter plane is allocated such a row. In the depicted embodiment the number of cylinder lenses 119 in each row extending in the direction of the X axis is equal to the number of plates of the plate fan 111b.

The number of plates of the plate fan 115b is likewise equal to the product of the number of plates of the plate fan 111b and the number of planes of the laser bars 104 or of the emitter planes of the laser diode arrangement 102a.

In the depicted embodiment therefore the number of plates of the plate fan 115b in the case of a total of four emitter planes and five plates of the plate fan 111b is twenty.

FIGS. 27 and 28 show as a further possible embodiment a diode laser 101c, which likewise comprises the laser diode arrangement 102c corresponding to the laser diode arrangement 102a and has four laser bars 104 arranged in different planes as well as the laser optical unit 108c, which comprises the fast axis collimators 106 downstream from the laser diode arrangement 102c in the beam path, the microlens array 18 with the rows of cylinder lenses 119, the two plate fans 111c corresponding to the plate fans 111a and the plate fan 115c corresponding to the plate fan 115a, i.e. the laser optical unit 108c corresponds to the laser optical unit 108a, however with the difference that instead of the cylinder lens 116 serving as the slow axis collimator, the slow axis collimation is likewise effected upstream from the first plate fan 111c by the lens array 118.

FIGS. 29 and 30 show a diode laser 101d, which differs from the diode laser 101c essentially only in that the lens array 118 for slow axis collimation is arranged in the beam path upstream from the fast axis collimators 106. The plate fans 111d and 115d correspond to the plate fans 111c and 115c.

FIGS. 31 and 32 show as a further possible embodiment a diode laser 101e, which differs from the diode laser 101c of FIGS. 27 and 28 essentially in that in the beam path downstream from the plate fans 115e a lens 120 is provided which effects a widening of the beam in the slow axis, i.e. in the depiction in FIGS. 31 and 32, in the X axis. The lens 120, which is designed as a concave cylinder lens and lies with its axis of curvature in the Y axis, is followed by a cylinder lens 116e corresponding to the cylinder lens 16 and designed as a convex curved lens. The cylinder lens 116e functions as a slow axis collimator, namely in that the widened diverging beam in the slow axis (X axis) is shaped to form a parallel beam with a beam width that is equal to or approximately equal to the width of the beam in the fast axis (Y axis), so that an improved focus 105 is then achieved with the focusing lens 117. The plate fans designated 111e and 115e in FIGS. 31 and 32 correspond to the plate fans 111c and 115c and are designed in the same manner as described for the plate fans 111c and 115c.

The diode laser 101e further comprises the diode laser arrangement 102e corresponding to the diode laser arrangement 102. The two plate fans 111e and 115e are components of the laser optical unit 108e, namely together with the fast axis collimators and the slow axis collimators as well as the lenses 116e, 117 and 120.

Many diverse variants of the diode laser 101e are conceivable. For example, it is possible to dispense with the lens 120 for widening of the laser beam and to effect an additional slow axis collimation with the lens 116e. Further, it is also possible to exchange the slow axis collimators (microlens array 118) and fast axis collimators 106 in the beam path upstream from the first shaping element, i.e. upstream from the plate fans 111e in the beam path, namely so that corresponding to FIGS. 29 and 30, the fast axis collimators are downstream from the slow axis collimators in the beam path.

The invention was described above based on exemplary embodiments. It goes without saying that numerous modifications and variations are possible without abandoning the underlying inventive idea upon which the invention is based.

For example, it is possible that the plates 12 of the plate fans 8 and 9 are twisted respectively relative to one another on a common fan plane which is in the plane of the plate narrow side 13. Other embodiments are conceivable here as well, for example the plates of the plate fans can also be twisted in a fan-like manner on several axes, namely two plates on one axis respectively. Further, the chosen position of the axis or axes can also be different than as described above.

It was assumed above that each emitter 4.1 is allocated one plate 12 or 112. Generally it is also possible to allocate each plate 12 at least of the plate fan 8 or each plate 112 at least of the plate fan 111 to a group of emitters 4.1 of the respective laser bar, for example a group of two to five emitters 4.1.

It was further assumed above that the fast axis collimator 6 is a common optical element for all emitters 4.1. Generally it is also possible to provide for each emitter 4.1 or respectively for a group of a few emitters, for example of two or three emitters 4.1, a separate fast axis collimator, which then preferably is individually adjustable, i.e. for example adjustable in at least one axis (e.g. X axis, Y axis and/or Z axis) and can be turned on at least one axis (e.g. X axis, Y axis and/or Z axis).

It is further possible that the plates 12 of at least one plate fan 8 or 9 are formed respectively by at least two consecutive individual plates without a crossing angle, which then optically have the function of a single plate.

REFERENCE LIST

1, 1a, 1c diode laser
2, 2a laser diode arrangement
3 substrate
4 laser bar
5 band-like laser beam
5' individual beam
6 fast axis collimator
7 optical arrangement
8, 9 plate fan
10, 11 plate fan side
12 plate
13, 14 plate side
15 gap
16 point
17 slow axis collimator
18 focusing lens
19 focusing optical unit
22 step mirror
23 mirror surface
101, 101a diode laser
102, 102a laser diode arrangement
103 substrate
104 laser bar
105 focus
106 fast axis collimator
107 laser beam
107' partial beam
107" shaped beam
108, 108a laser optic
109 partial beam group
110 focusing arrangement
111 plate fan
112 plate
113, 114 narrow side
115, 115a plate fan
115' individual plate fan
116 cylinder lens
117 focusing lens
X axis
Y axis
Z axis
X-Z plane
Y-Z plane
X-Y plane
x, x' dimension
y distance
y'/y" height

What is claimed is:

1. A laser optical system for shaping at least one laser beam bundle comprising a plurality of laser beams generated by emitters, the emitters being offset relative to one another in a slow axis (X axis) of the plurality of laser beams and at a distance from one another, with at least one plate fan located in a beam path of the laser beam bundle, the at least one plate fan comprises several plates made of a light transmitting material, the several plates are arranged offset in a direction perpendicular to their surface sides and are arranged with their surface sides in planes which enclose a beam direction (Z axis) and a fast axis (Y axis) of the plurality of laser beams, the several plates forming first flat plate narrow sides for a beam entry and opposite the first flat plate narrow sides, second flat plate narrow sides for a beam exit, wherein the several plates of the at least one plate fan are arranged so that each emitter, or each group consisting of a maximum of five emitters of at least two emitters, is allocated a separate plate and that a plate thickness of the plates is selected so that the laser beams pass through each plate without reflection in an area of the plate surface sides, wherein the several plates of the at least one plate fan have a plate thickness which is at least equal to a divergence of the plurality of laser beams of each emitter or of each emitter group associated with the several plates in the slow axis on the second flat plate narrow sides.

2. The laser optical system according to claim 1, wherein the several plates of the at least one plate fan have a plate thickness which is at least equal to, or greater than a divergence exhibited by the at least one laser beam passing through the respective plate on the second flat plate narrow side.

3. The laser optical system according to claim 1, wherein each plate is allocated only one emitter or only one laser beam.

4. The laser optical system according to claim 1, wherein an emitter distance between two mutually adjacent emitters or two mutually adjacent emitter groups in a direction of the slow axis is equal to a thickness of the or is a multiple of the thickness of the plates.

5. The laser optical system claim 1, wherein at least one fast axis collimator is provided in a beam path between the emitters and the at least one plate fan.

6. The laser optical system according to claim 5, wherein the at least one fast axis collimator is provided jointly for all emitters.

7. The laser optical system according to claim 5, wherein a plurality of fast axis collimators individually adjustable fast axis collimators, is provided, namely one fast axis collimator for each emitter or emitter group.

8. The laser optical system according to claim 1, wherein the at least one plate fan effects a fanning out of the at least one laser beam bundle into several partial beams which are offset relative to one another both in the fast axis and in the slow axis.

9. The laser optical system according to claim 1, wherein the beam path, following the at least one plate fan at least one further shaping element is provided for concentrating the partial beams fanned out by the plate fan.

10. The laser optical system according to claim 9, wherein the further shaping element is a further plate fan whose plates are oriented with their surface sides perpendicular to the fast axis of the laser beams.

11. The laser optical system according to claim 1, wherein the first and second flat plate narrow sides of the at least one plate fan are twisted relative to one another in a fan-like manner so that the first flat plate narrow side of each plate lies in a plane (E) which encloses an angle ($\alpha$) with the plane of the first flat plate narrow side of each adjacent plate, that the first flat plate narrow sides in their entirety form a first plate fan side and the second flat plate narrow sides in their entirety form a second plate fan side for the entry or exit of the at least one laser beam passing through the plate fan, and that the planes (E) of the first and second flat plate narrow sides and the fan axis (A) are oriented perpendicular to the surface sides of the plates.

12. The laser optical system according to claim 1, wherein the first and second flat plate narrow sides on each plate are arranged parallel or essentially parallel to one another.

13. The laser optical system according to claim 1, wherein the plates of the plate fan are formed by at least two consecutive single plates.

14. The laser optical system according claim 1, wherein in at least two emitter planes (X-Z plane) which are arranged parallel to one another and are at a distance (y) from one another in an axis (Y axis) perpendicular to the emitter planes (X-Z plane) at least one emitter group is provided, that the laser beams of each emitter group is shaped by a first shaping element to form a separate partial beam group from fanned out partial beams, that the partial beam groups are offset relative to one another in the second axis (Y axis) and that the partial beams of all partial beam groups are shaped by the second shaping element to form the shaped laser beam emerging from the second shaping element.

15. The laser optical system according to claim 14, wherein the partial beam groups formed by the first shaping element are shifted in the second axis (Y axis) in such a way that the distance (y') between similar partial beams of adjacent groups corresponds to the distance (y) of the emitter planes (X-Z planes) of the laser diode arrangement.

16. The laser optical system according to claim 14, wherein the emitter groups are formed by a laser bar comprising a plurality of emitters.

17. The laser optical system according to claim 1, wherein one emitter group is provided in each emitter plane (X-Z plane).

18. The laser optical system according to claim 1, wherein the first shaping element is formed by at least one first plate fan.

19. The laser optical system according to claim 18, wherein the first plate fan is provided jointly for all emitter planes.

20. The laser optical system according to claim 1, wherein the second shaping element is formed by at least one second plate fan.

21. The laser optical system according to claim 20, wherein the second plate fan is provided jointly for all partial beam groups of the laser beams shaped by the first shaping element.

22. The laser optical system according to claim 21, wherein the second plate fan consists of several mutually adjacent individual plate fans and comprises one individual plate fan for each partial beam group.

23. The laser optical system according to claim 20, wherein the second plate fan comprises a plurality of plates made of a light transmitting material and that the number of these plates is equal to the number of partial beams formed by the first shaping element.

24. The laser optical system according to claim 20, wherein the second plate fan comprises a plurality of plates made of a light transmitting material and that the number of these plates is equal to the number of emitter planes (X-Z plane) multiplied by the number of plates which the at least one first plate fan comprises.

25. The laser optical system according claim 1, further comprising collimators in the beam path of the laser light beam.

26. The laser optical system according to claim 1, further comprising a focusing optical unit for focusing of the shaped laser beam to form a focus.

27. A diode laser with a laser diode arrangement and laser optical system for shaping at least one laser beam bundle comprising a plurality of laser beams generated by emitters, the emitters being offset relative to one another in a slow axis (X axis) of the laser beams and at a distance from one another, with at least one plate fan located in the beam path of the laser beam bundle, the at least one plate fan consists of several plates made of a light transmitting material, the several plates are arranged offset in a direction perpendicular to surface sides of the several plates and the several plates are arranged with the surface sides in planes which enclose the beam direction (Z axis) and the fast axis (Y axis) of the laser beams, the several plates forming first flat plate narrow sides for a beam entry and opposite the first flat plate narrow side, second flat plate narrow sides for the beam exit, wherein the several plates of the at least one plate fan are arranged so that each emitter, or each group of emitters consisting of a maximum of five of at least two is allocated a separate plate and that a plate thickness of the several plates is selected so that the plurality of laser beams pass through each plate without reflection in an area of the plate surface sides, wherein the several plates of the at least one plate fan have a plate thickness which is at least equal to a divergence of the plurality of laser beams of each emitter or of each emitter group associated with the several plates in the slow axis on the second flat plate narrow sides.

* * * * *

UNITED STATES PATENT AND TRADEMARK OFFICE
CERTIFICATE OF CORRECTION

PATENT NO.           : 8,520,311 B2
APPLICATION NO.      : 12/656787
DATED                : August 27, 2013
INVENTOR(S)          : Volker Krause and Christoph Ullmann It is certified that error appears in the above-identified patent and that said Letters Patent is hereby corrected as shown below:

In the Claims

Column 16, line 30, cancel the text beginning with "27. A diode laser" to and ending "plate narrow sides", and insert the following claim:

--27. A diode laser with a laser diode arrangement and laser optical system for shaping at least one laser beam bundle comprising a plurality of laser beams generated by emitters, the emitters being offset relative to one another in a slow axis (X axis) of the laser beams and at a distance from one another, with at least one plate fan located in the beam path of the laser beam bundle, the at least one plate fan consists of several plates made of a light transmitting material, the several plates are arranged offset in a direction perpendicular to surface sides of the several plates and the several plates are arranged with the surface sides in planes which enclose the beam direction (Z axis) and the fast axis (Y axis) of the laser beams, the several plates forming first flat plate narrow sides for a beam entry and opposite the first flat plate narrow sides, second flat plate narrow sides for the beam exit, wherein the several plates of the at least one plate fan are arranged so that each emitter, or each group of emitters consisting of a maximum of five of at least two is allocated a separate plate and that a plate thickness of the several plates is selected so that the plurality of laser beams pass through each plate without reflection in an area of the plate surface sides, wherein the several plates of the at least one plate fan have a plate thickness which is at least equal to a divergence of the plurality of laser beams of each emitter or of each emitter group associated with the several plates in the slow axis on the second flat plate narrow sides.--

Signed and Sealed this
Twenty-ninth Day of April, 2014

Michelle K. Lee
*Deputy Director of the United States Patent and Trademark Office*